United States Patent
Zamir et al.

(10) Patent No.: US 12,261,638 B2
(45) Date of Patent: Mar. 25, 2025

(54) WIDEBAND COMMUNICATION SYSTEM AND A METHOD THEREOF

(71) Applicant: ELBIT SYSTEMS C4I AND CYBER LTD., Netanya (IL)

(72) Inventors: Ezra Zamir, Netanya (IL); Yizhack Yadgar, Netanya (IL); Shaul Baruch Laufer, Netanya (IL)

(73) Assignee: ELBIT SYSTEMS C4I AND CYBER LTD., Netanya (IL)

( * ) Notice: Subject to any disclaimer, the term of this patent is extended or adjusted under 35 U.S.C. 154(b) by 0 days.

(21) Appl. No.: 18/424,899

(22) Filed: Jan. 29, 2024

(65) Prior Publication Data

US 2024/0235604 A1    Jul. 11, 2024

Related U.S. Application Data

(63) Continuation of application No. PCT/IL2022/050695, filed on Jun. 28, 2022.

(30) Foreign Application Priority Data

Aug. 29, 2021 (IL) .......................................... 285982

(51) Int. Cl.
  H04B 1/69      (2011.01)
  H04B 10/548    (2013.01)
(52) U.S. Cl.
  CPC ............. H04B 1/69 (2013.01); H04B 10/548 (2013.01)
(58) Field of Classification Search
  CPC ................................ H04B 1/69; H04B 10/548
  USPC ....................................................... 375/146
  See application file for complete search history.

(56) References Cited

U.S. PATENT DOCUMENTS

| 4,977,578 | A | 12/1990 | Ishigaki et al. |
| 5,303,258 | A | 4/1994 | Nakamura |
| 5,712,869 | A * | 1/1998 | Lee .................. H04B 1/707 370/209 |
| 6,072,994 | A | 6/2000 | Phillips et al. |
| 6,324,209 | B1 * | 11/2001 | Li .................. H04B 7/2628 375/140 |
| 7,873,097 | B1 | 1/2011 | Luecke et al. |
| 8,026,837 | B1 | 9/2011 | Valley et al. |
| 2002/0126644 | A1 | 9/2002 | Turpin et al. |
| 2004/0090353 | A1 | 5/2004 | Moore |

(Continued)

FOREIGN PATENT DOCUMENTS

| CN | 113131966 | * | 7/2021 | .......... H04L 27/2062 |
| CN | 113131966 | A * | 7/2021 | ............. H04B 1/692 |

(Continued)

OTHER PUBLICATIONS

CN 113131966 A English Translation (Year: 2021).*

(Continued)

*Primary Examiner* — Ted M Wang
(74) *Attorney, Agent, or Firm* — S. J. Intellectual Property Ltd.

(57) ABSTRACT

A wireless transmitting method comprising: obtaining a first-spread-spectrum-signal (SS1-signal); producing a doubly-spread-spectrum-signal (SS2-signal) from the SS1-signal utilizing a spreading-sequence out of at least one spreading-sequence; modulating the SS2-signal to a Radio-Frequency SS2-signal (RF-SS2-signal); and transmitting the RF-SS2-signal.

19 Claims, 5 Drawing Sheets

(56) References Cited

U.S. PATENT DOCUMENTS

| | | | |
|---|---|---|---|
| 2005/0063705 | A1 | 3/2005 | Moorthy et al. |
| 2005/0100076 | A1 | 5/2005 | Gazdzinski et al. |
| 2007/0153875 | A1 | 7/2007 | Lakkis et al. |

FOREIGN PATENT DOCUMENTS

| | | |
|---|---|---|
| CN | 108965188 B | 8/2021 |
| EP | 1619922 A2 | 1/2006 |
| JP | H04177934 A | 6/1992 |

OTHER PUBLICATIONS

CN 113131966 English Translation (Year: 2021).*
Sandhu GS, Jul. 20, 2007—Radio Over Fiber System for Wireless Lan (Doctoral Dissertation)—Radio-over-Fiber (RoF) technology has been identified as a technique to increase the capacity of wireless data networks.
Metcalf AJ, May 1, 2012—Fully Programmable Two-Dimensional Ultra-Complex Broadband Fine-Resolution Pulse Shaping. PhDT. May 2012—We present a fully programmable pulse shaping apparatus capable of simultaneous amplitude and phase control at a very fine resolution over a broad bandwidth.
Heritage JP, Weiner AM, Sep. 1, 2007—Advances in Spectral Optical Code-Division Multiple-Access Communicati, Ons. IEEE journal of selected topics in quantum electronics.
Weiner, A.M., May 23, 2007—Fourier Information Optics for the Ultrafast Time Domain. Applied optics, 47(4), pp. A88-A96—Ultrafast photonic signal processing based on Fourier optics principles offers exciting possibilities to go beyond the processing speeds of electronics technologies for applications in high-speed fiber communications and ultrawideband wireless.
Delfyett, P.J., Ozdur, I., Hoghooghi, N., Akbulut, M., Davila-Rodriguez, J. and Bhooplapur, S., Jan. 1, 2012. Advanced Ultrafast Technologies Based on Optical Frequency Combs.
Esman, D., Ataie, V., Kuo, B.P.P., Alic, N. and Radic, S., Jan. 1, 2016. Subnoise Signal Detection and Communication. Journal of Lightwave Technology, 34(22), pp. 5214-5219.
Reddy, Y.B et al., "Asynchronous W-CDMA uplink performance in double spread cascaded RoF systems," Fourth International Conference on Information, Communications and Signal Processing, 2003 and the Fourth Pacific Rim Conference on Multimedia. Proceedings of the 2003 Joint, Singapore, 2003, pp. 1273-1277 vol. 2, doi: 10.1109/ICICS.2003.1292666.
Decusatis, C. M. et al., "Spread-spectrum techniques in optical communication using transform domain processing," in IEEE Journal on Selected Areas in Communications, vol. 8, No. 8, pp. 1608-1616, Oct. 1990, doi: 10.1109/49.62838.

\* cited by examiner

WIDEBAND COMMUNICATION SYSTEM AND A METHOD THEREOF

TECHNICAL FIELD

The present disclosed subject matter relates to high-bandwidth communications. More particularly, the present disclosed subject matter relates to boosting communications' processing gain and transmission rate over a large portion of the radio spectrum.

BACKGROUND

In today's technological age, the demand for wireless Radio Frequency (RF) communication devices and equipment in the private, commercial and military sectors alike is dramatically growing. Wireless (Radio) communication is known to be based on the electromagnetic spectrum, which is limited due to shortage and restricted accessibility to the spectrum. Thus, limiting the bandwidth to narrow frequency bands prevents interference between users.

Direct Sequence Spread Spectrum (DSSS) is a commercially available technique used for spreading a transmission signal across a wider bandwidth. By using this concept, the transmission power at the frequency bands can be made too small to cause unwanted interference to other users. In a nutshell, the spread spectrum is a communication technique that spreads a narrowband communication signal over a wide range of frequencies for transmission, and then de-spreading it into the original data bandwidth at the receiver. The Spread spectrum is characterized by wide bandwidth and low power spectral density. Jamming and interference have less effect on the spread spectrum because it resembles white noise, thus hard to detect and hard to intercept.

However, this technique significantly increases real-time processing resources required at the transmitter and at the receiver, consequently limiting the bandwidth range in which the signal can be spread.

BRIEF SUMMARY

According to a first aspect of the present disclosed subject matter, there is provided a wireless transmitting method comprising: obtaining a first-spread-spectrum-signal (SS1-signal); producing a doubly-spread-spectrum-signal (SS2-signal) from the SS1-signal utilizing a spreading-sequence out of at least one spreading-sequence; modulating the SS2-signal to a Radio-Frequency SS2-signal (RF-SS2-signal); and transmitting the RF-SS2-signal.

In some exemplary embodiments, the producing the SS2-signal comprises multiplying the SS1-signal by the spreading-sequence of the at least one spreading-sequence.

In some exemplary embodiments, the producing the SS2-signal comprises: converting the SS1-signal to an optical-signal by sampling the SS1-signal with optical pulses emitted by an optical-generator into an optical-modulator that receives the SS1-signal; transforming the optical-signal to a frequency-domain-optical-signal characterized by a plurality of spectral components; encoding the frequency-domain-optical-signal, by a spatial light modulator (SLM) configured as an SLM-encoder that comprises the at least one spreading-sequence and yielding a frequency-domain-encoded-optical-signal; transforming the frequency-domain-encoded-optical-signal to a time-domain-encoded-optical-signal; and converting the time-domain-encoded-optical-signal to the SS2-signal.

In some exemplary embodiments, the converting the time-domain-encoded-optical-signal comprises preserving a phase of the time-domain-encoded-optical-signal.

In some exemplary embodiments, the encoding the frequency-domain-optical-signal comprises optically traversing the plurality of spectral components through the spreading-sequence of the SLM-encoder.

In some exemplary embodiments, the traversing comprises passing the plurality of spectral components through at least one row of pixels of the SLM-encoder, wherein the spreading-sequence is associated with one or more rows of pixels of the at least one row of pixels.

In some exemplary embodiments, the sampling the SS1-signal with optical pulses comprises emitting periodic light pulses generated by a laser based optical-generator.

In some exemplary embodiments, the encoding the frequency-domain-optical-signal further comprises pre-emphasizing the frequency-domain-optical-signal.

In some exemplary embodiments, the obtaining the SS1-signal comprises producing the SS1-signal by a Direct Sequence Spread Spectrum (DSSS) coding with the spreading-sequence or another spreading-sequence out of the at least one spreading-sequence.

In some exemplary embodiments, the second-spreading-sequence is selected from the group consisting of a general complex spreading-sequence; a bi-phase spreading-sequence; or a polyphase spreading-sequence; and any combination thereof.

In some exemplary embodiments, the wireless transmitting method further comprising routing the SS2-signal to an external transceiver for the modulating the SS2-signal to an RF-SS2-signal and the transmitting the RF-SS2-signal.

In some exemplary embodiments, the transmitting the RF-SS2-signal comprises transmitting a plurality of identical information replicas encapsulated in the RF-SS2-signal.

According to a another aspect of the present disclosed subject matter, there is provided a method of de-spreading, by a wireless receiver, signals transmitted by a wireless transmitter capable of producing an SS2-signal from an SS1-signal using a spreading-sequence out of at least one spreading-sequence, the method comprising: obtaining a received-doubly-spread-spectrum-signal (RSS2-signal) either from an external transceiver or from a frequency-converter of the wireless receiver; and producing an extracted-first-spread-spectrum-signal (ESS1-signal) from the RSS2-signal utilizing a second-de-spreading-sequence out of at least one de-spreading-sequence, wherein the de-spreading-sequence out of the at least one de-spreading-sequence is associated with a corresponding spreading-sequence out of the at least one spreading-sequence.

In some exemplary embodiments, the producing ESS1-signal comprises: correlating the RSS2-signal with the de-spreading-sequence out of the at least one de-spreading-sequence, thereby forming a correlated-signal; sampling the correlated-signal within a correlation pulse width; and assembling the ESS1-signal based on the correlating the RSS2-signal and the sampling the correlated-signal.

In some exemplary embodiments, the assembling the ESS1-signal comprises: probing the RSS2-signal at a rate defined by a time-shift between consecutive probings, wherein the probing occurs at least once per chip; generating the correlation pulse by calculating a sum of multiplications of the de-spreading-sequence by an outcome of the probing in each time-shift; performing a noncoherent integration of the outcome of the probing in each time-shift, resulting in a plurality of noncoherent integrations; searching for a highest value outcome of the noncoherent integration out of the plurality of noncoherent integrations; and determining a synchronization area within boundaries of the correlation pulse.

In some exemplary embodiments, the assembling the ESS1-signal comprises executing a serial search technique for determining optimal sampling timing of the correlation pulse.

In some exemplary embodiments, the producing the ESS1-signal comprising: converting the RSS2-signal to an optical-signal by an optical-modulator and an optical-generator; transforming the optical-signal to a frequency-domain-optical-signal characterized by a plurality of spectral components; decoding the frequency-domain-optical-signal by an SLM configured as an SLM-decoder comprising the de-spreading-sequence, thereby yielding a frequency-domain-decoded-optical-signal; transforming the frequency-domain-decoded-optical-signal to a time-domain-decoded-optical-signal; optically-sampling the time-domain-decoded-optical-signal within an optical correlation pulse width for yielding an optically sampled time-domain-correlated-optical-signal; and converting the optically sampled time-domain-correlated-optical-signal to the ESS1-signal.

In some exemplary embodiments, the method further comprising filtering the ESS1-signal.

In some exemplary embodiments, the optically-sampling the time-domain-decoded-optical-signal comprises: optically-probing the time-domain-decoded-optical-signal at a plurality of time-shifts; performing a noncoherent integration for each outcome of the optically-probing in each time-shift, resulting in a plurality of noncoherent integrations; searching for a highest value outcome of the noncoherent integration out of the plurality of noncoherent integrations; and determining a synchronization area within boundaries of the optical correlation pulse width.

In some exemplary embodiments, the optically-sampling the time-domain-decoded-optical-signal utilizes a serial search technique for determining an optimal optical sampling timing of the optical correlation pulse.

In some exemplary embodiments, the decoding the frequency-domain-optical-signal comprises optically traversing the plurality of spectral components through the de-spreading-sequence of the SLM-decoder.

In some exemplary embodiments, the traversing comprises passing of the plurality of spectral components through at least one row of pixels of the SLM-decoder, wherein the de-spreading-sequence is associated with one or more rows of pixels of the at least one row of pixels.

In some exemplary embodiments, the converting the RSS2-signal comprises emitting continuous light generated by a laser based optical-generator into the optical-modulator.

In some exemplary embodiments, the producing the ESS1-signal comprising decoding the RSS2-signal with a DSSS-decoder utilizing the de-spreading-sequence out of the at least one de-spreading-sequence.

In some exemplary embodiments, the de-spreading-sequence is selected from the group consisting of a general complex de-spreading-sequence; a bi-phase de-spreading-sequence; a polyphase de-spreading-sequence; and any combination thereof.

In some exemplary embodiments, the decoding the frequency-domain-optical-signal further comprises filtering interferences from the frequency-domain-optical-signal.

In some exemplary embodiments, the method further comprises correlating the ESS1-signal with the de-spreading-sequence or another de-spreading-sequence out of the at least one de-spreading-sequence for yielding a data-signal utilizing a DSSS decoding.

In some exemplary embodiments, the method further comprises routing the ESS1-signal to the external transceiver for correlating the ESS1-signal to a data-signal out.

In some exemplary embodiments, the obtaining the RSS2-signal comprising demodulating, by the frequency-converter, an RF-RSS2-signal into the RSS2-signal.

In some exemplary embodiments, the obtaining the RSS2-signal further comprises extracting a plurality of information replicas encapsulated in the RSS2-signal, wherein the replicas are used for improving a signal to noise ratio of the RSS2-signal.

According to yet another aspect of the present disclosed subject matter, there is provided a transmitter's cascaded spread-spectrum system, the system comprising: a first-spreader that utilizes a spreading-sequence to spread a data-signal to a SS1-signal, wherein the bandwidth of the SS1-signal is greater than the bandwidth of the data-signal; and a second-spreader that utilizes the spreading-sequence or another spreading-sequence to spread the SS1-signal to a SS2-signal, wherein the bandwidth of the SS2-signal is greater than the bandwidth of the SS1-signal.

In some exemplary embodiments, the second-spreader is an optical spreader comprising: an optical-generator; an optical-modulator adapted to utilize the optical-generator to convert the SS1-signal to a time-domain-optical-signal; Fourier-transform-optics utilized to transform the time-domain-optical-signal to frequency-domain-optical-signal; an SLM configured as an SLM-encoder comprising the second-spreading-sequence configured to encode the frequency-domain-optical-signal to a frequency-domain-encoded-optical-signal; an inverse-Fourier-transform-optics adapted to transform the frequency-domain-encoded-optical-signal to a time-domain-encoded-optical-signal; and an optical to electrical converter adapted to convert the time-domain-encoded-optical-signal to an SS2-signal.

In some exemplary embodiments, the system further comprises a frequency-converter utilized to modulate the SS2-Signal to an RF-SS2-signal and route the RF-SS2-signal to at least one of: a transmission amplifier or an external transceiver.

In some exemplary embodiments, the second-spreader obtain the SS1-signal from the external transceiver.

In some exemplary embodiments, the system further comprising a processor configured to: (a) control the optical-generator; (b) provide the first-spreader with at least one spreading-sequence; (c) provide the second-spreader with at least one spreading-sequence; and (d) provide the frequency-converter with a carrier-signal.

In some exemplary embodiments, the processor is configured to provide the SLM-encoder with at least one spreading-sequence.

In some exemplary embodiments, the first-spreader utilize a DSSS encoder to spread the data-signal to an SS1-signal.

According to yet another aspect of the present disclosed subject matter, there is provided a receiver's cascaded spread-spectrum system, the system comprising: a second de-spreader that utilizes a de-spreading-sequence to de-spread an RSS2-signal to an ESS1-signal, wherein the bandwidth of the RSS2-signal is greater than the bandwidth of the ESS1-signal; a first de-spreader that utilizes the de-spreading-sequence or another de-spreading-sequence to de-spread the ESS1-signal to a data-signal, wherein the bandwidth of the ESS1-signal is greater than the bandwidth of the data-signal.

In some exemplary embodiments, the second de-spreader is an optical correlator comprising: an optical-generator used to emit light; an optical-modulator adapted to utilize the optical-generator to convert the RSS2-signal to a time-domain-optical-signal; Fourier-transform-optics utilized to transform the time-domain-optical-signal to a frequency-domain-optical-signal; SLM configured as an SLM-decoder comprising the de-spreading-sequence configured to decode the frequency-domain-optical-signal to a frequency-domain-decoded-optical-signal; an inverse-Fourier-transform-optics adapted to transform the frequency-domain-decoded-optical-signal to a time-domain-decoded-optical-signal; a pulse detector and a noncoherent-integrator mutually utilized to determine a synchronization area within an optical correlation pulse width, wherein the time-domain-decoded-optical-signal is extracted from the synchronization area; and an optical to electrical converter adapted to convert the time-domain-decoded-optical-signal to an ESS1-signal.

In some exemplary embodiments, the pulse detector and the noncoherent-integrator are utilized for: (a) optically-probing the time-domain-decoded-optical-signal at a plurality of time-shifts; (b) performing a noncoherent integration for each time-shift of the optically-probing, resulting in a plurality of noncoherent integrations; (c) searching for a highest value outcome of the noncoherent integration out of the plurality of noncoherent integrations; (d) and determining a synchronization area within boundaries of an optical correlation pulse.

In some exemplary embodiments, the pulse detector and the first de-spreader utilize a serial search technique to determine an optimal optical sampling timing of the optical correlation pulse.

In some exemplary embodiments, the system further comprising a frequency-converter adapted to demodulate an RF-RSS2-Signal to the RSS2-signal.

In some exemplary embodiments, the ESS1-signal is routed to an external transceiver to de-spread the ESS1-signal to a data-signal.

In some exemplary embodiments, the system further comprising a processor configured to: (a) provide the first de-spreader with at least one de-spreading-sequence; (b) provide the second de-spreader with at least one de-spreading-sequence; and (c) provide the frequency-converter with carrier-signal.

In some exemplary embodiments, the processor is further configured to provide the SLM-decoder with at least one de-spreading-sequence.

In some exemplary embodiments, the system further comprising an analog filter that filters the ESS1-signal.

BRIEF DESCRIPTION OF THE DRAWINGS

Some embodiments of the disclosed subject matter described, by way of example only, with reference to the accompanying drawings. With specific reference now to the drawings in detail, it is stressed that the particulars shown are by way of example and for purposes of illustrative discussion of the preferred embodiments of the present disclosed subject matter only, and are presented in the cause of providing what is believed to be the most useful and readily understood description of the principles and conceptual aspects of the disclosed subject matter. In this regard, no attempt is made to show structural details of the disclosed subject matter in more detail than is necessary for a fundamental understanding of the disclosed subject matter, the description taken with the drawings making apparent to those skilled in the art how the several forms of the disclosed subject matter can be embodied in practice.

In the drawings.

DETAILED DESCRIPTION

Figure 1A:
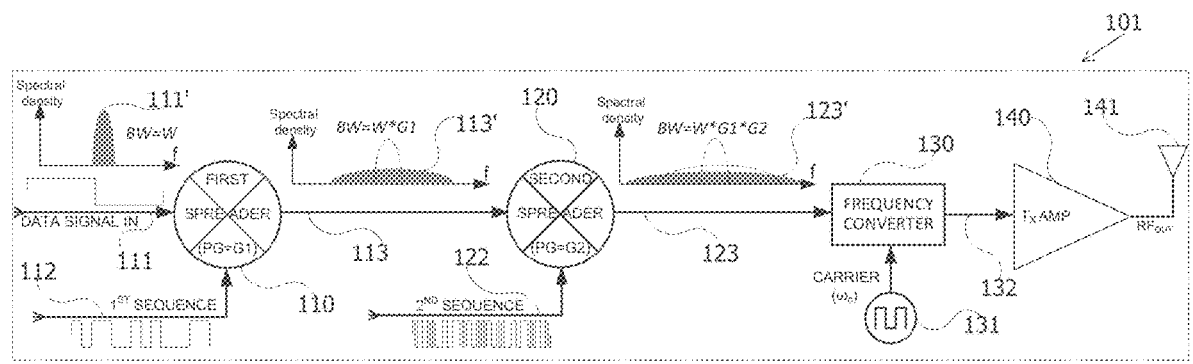
FIG. 1A shows a schematic block diagram of a transmitter utilizing a cascaded spread-spectrum system, in accordance with some exemplary embodiments of the disclosed subject matter.

In the following detailed description, numerous specific details are set forth in order to provide a thorough understanding of the presently disclosed subject matter. However, it will be understood by those skilled in the art that the presently disclosed subject matter can be practiced without these specific details. In other instances, well-known methods, procedures, and components have not been described in detail so as not to obscure the presently disclosed subject matter.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as Processor 210 or the like, include action and/or processes of a computer that manipulate and/or transform data into other data, said data represented as physical quantities, e.g., such as electronic quantities, and/or said data representing the physical objects. The terms "computer", "processor", "processing resource", "processing circuitry", and "controller" should be expansively construed to cover any kind of electronic device with data processing capabilities, including, by way of non-limiting example, a personal desktop/laptop computer, a server, a computing system, a communication device, a smartphone, a tablet computer, a smart television, a processor (e.g. digital signal processor (DSP), a microcontroller, a field programmable gate array (FPGA), an application specific integrated circuit (ASIC), etc.), a group of multiple physical machines sharing performance of various tasks, virtual servers co-residing on a single physical machine, any other electronic computing device, and/or any combination thereof.

The operations in accordance with the teachings herein can be performed by a computer specially constructed for the desired purposes or by a general-purpose computer specially configured for the desired purpose by a computer program stored in a non-transitory computer readable storage medium. The term "non-transitory" is used herein to exclude transitory, propagating signals, but to otherwise include any volatile or non-volatile computer memory technology suitable to the application.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus, the appearance of the phrase "one case", "some cases", "other cases" or variants thereof does not necessarily refer to the same embodiment(s).

It is appreciated that, unless specifically stated otherwise, certain features of the presently disclosed subject matter, which are, for clarity, described in the context of separate embodiments, can also be provided in combination in a single embodiment. Conversely, various features of the presently disclosed subject matter, which are, for brevity, described in the context of one exemplary embodiment, can also be provided separately or in any suitable sub-combination.

Figure 3:
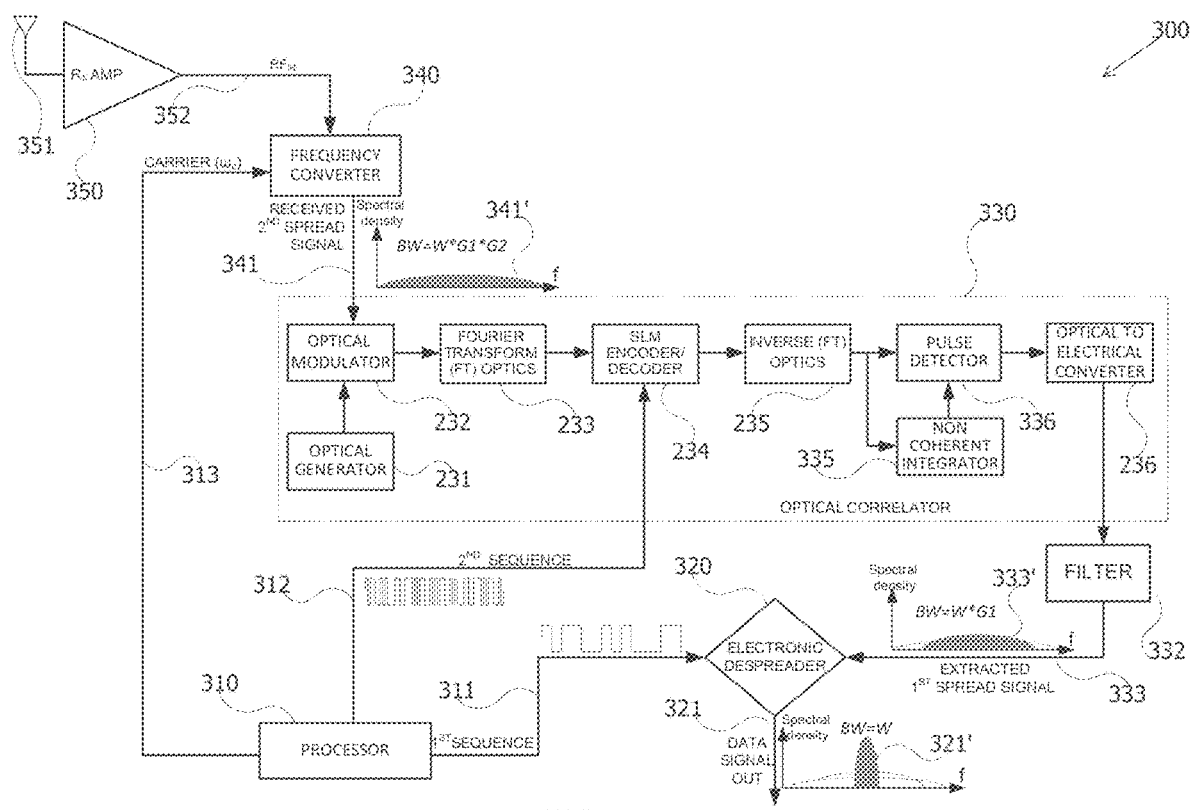
FIG. 3 shows a schematic block diagram of a receiver utilizing another cascaded de-spread-spectrum system, in accordance with some exemplary embodiments of the disclosed subject matter.
Figure 4:
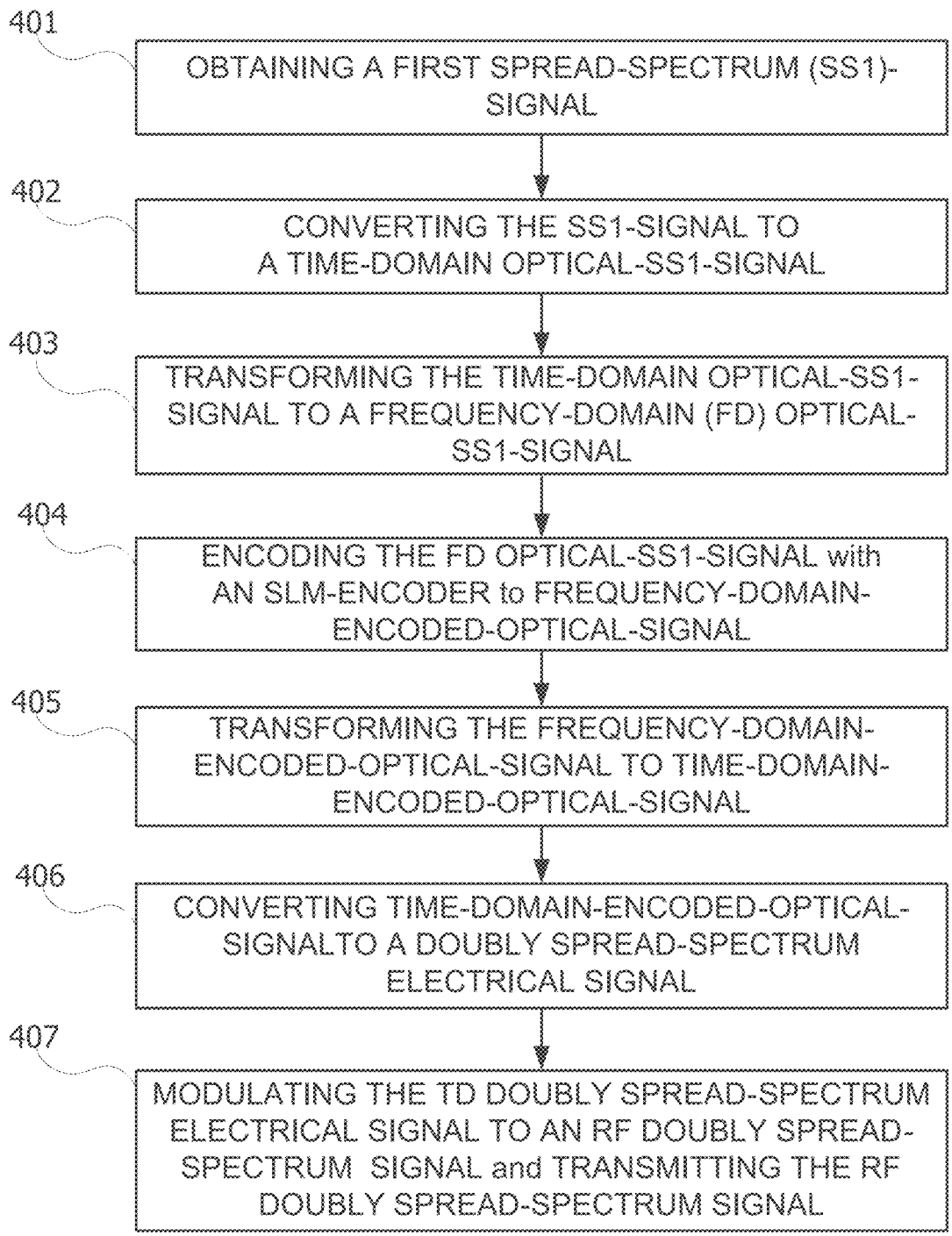
FIG. 4 shows a flowchart diagram of a transmitting method of the transmitter of FIG. 2, in accordance with some exemplary embodiments of the disclosed subject matter.
Figure 5:
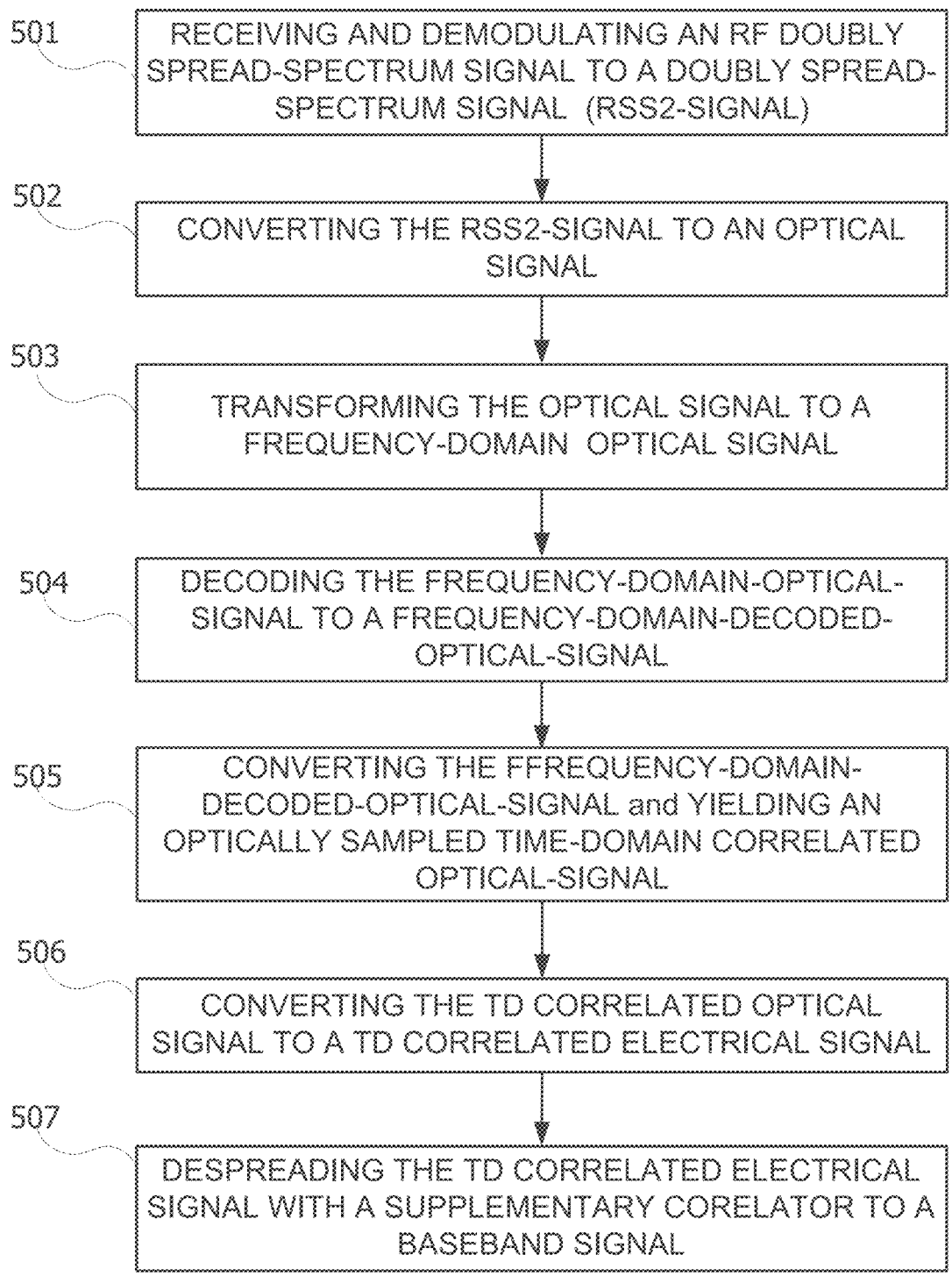
FIG. 5 shows a flowchart diagram of a receiving method of the receiver of FIG. 3, in accordance with some exemplary embodiments of the disclosed subject matter.

In embodiments of the presently disclosed subject matter, fewer, more and/or different stages than those shown in FIGS. 4 and 5 can be executed. In embodiments of the presently disclosed subject matter one or more stages illustrated in FIGS. 4 and 5 can be executed in a different order and/or one or more groups of stages can be executed simultaneously. FIGS. 1A, 1B, 2, and 3 illustrates a general schematic of the system architecture in accordance with one exemplary embodiment of the presently disclosed subject matter. Each module in FIGS. 1A, 1B, 2, and 3 can be made up of any combination of software, hardware and/or firmware that performs the functions as defined and explained herein. The modules in FIGS. 1A, 1B, 2, and 3 can be centralized in one location or dispersed over more than one location. In other embodiments of the presently disclosed subject matter, the system can comprise fewer, more, and/or different modules than those shown in FIGS. 1A, 1B, 2, and 3.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that can be executed by the system and should be applied mutatis mutandis to a non-transitory computer readable medium that stores instructions that can be executed by the system.

Any reference in the specification to a non-transitory computer readable medium should be applied mutatis mutandis to a system capable of executing the instructions stored in the non-transitory computer readable medium and should be applied mutatis mutandis to method that can be executed by a computer that reads the instructions stored in the non-transitory computer readable medium.

One technical problem dealt with by the disclosed subject matter is a need to prevent even stronger jamming signals from interfering with wireless communication and to avoid further division of the electromagnetic spectrum in advance.

One technical solution is to allow for even further spreading the bandwidth of a transmitted signal significantly beyond what is available today, for example spreading the bandwidth of the transmitted signal to about 10 Gigahertz.

Another technical problem dealt with by the disclosed subject matter is that further attempting to spread the transmitted signal bandwidth, using existing techniques, results in a loss that exceeds the profit. The reason being that using existing techniques significantly increases required processing resources. Performing the calculations in real-time in the transmitter and the receiver will require immense resources for sampling, and digital signal processing. Which will lead to a dramatic increase in size, weight, cost, and power consumption. It will also be appreciated that a significant increase in processing gain alone, i.e., no bandwidth increase accordingly, causes a significant reduction in the data rate per user.

Another technical solution is cascading at least two spreaders on the transmitter side and respectively at least two correlators on the receiver side. In some exemplary embodiments, the transmitter's first spreader and the receiver's second correlator can utilize digital signal processing technology. Whereas the transmitter's second (doubly) spreader and the receiver's first (doubly) correlator can be implemented using optical processing technique of the present disclosure.

In some exemplary embodiments, the transmitter's second-spreader and the receiver's second-correlator, of the present disclosure, can be provided for upgrading existing transmitters and receivers having spread spectrum. The upgrade can be implemented by cascading at least one second-spreader to an egress of the existing transmitter and respectively cascading at least one second-correlator to an ingress of the existing receiver. In conclusion, cascading additional spreaders/correlators increases the total processing gain and the total bandwidth of the augmented system.

Reference is now made to FIG. 1A, showing a schematic block diagram of a transmitter utilizing a cascaded spread-spectrum system, in accordance with some exemplary embodiments of the disclosed subject matter.

FIG. 1A depicts a transmitter's cascaded spread-spectrum system implemented in a Transmitter (Tx) 101 of the present disclosure. Tx 101 is a wireless transmitter designed to encode information originating in an input signal, i.e., a signal having information to be transmitted, by Tx 101. Tx 101 can be also designed to transmit signals having wider bandwidth (BW) than its input signal BW.

In some exemplary embodiments, Tx 101 is adapted for encoding high bitrate data signals. In some exemplary embodiments, Tx 101 can comprise a First-Spreader 110 and a Second-Spreader 120 connected in series to First-Spreader 110 egress.

In some exemplary embodiments, First-spreader 110 multiplies a Data-In-Signal 111, comprising information to be transmitted, by a First-Spreading-Sequence (1SpSeq) 112, thereby producing a First-Spread-Spectrum-Signal (SS1-Signal) 113. It will be noted that spreading-sequences of the present disclosure comprise a number of bits per second (chips per second). Different spreading-sequences can be utilized by Tx 101 for spreading (encoding) Data-In-Signal 111 for each transmission uniquely.

It will be noted that 1SpSeq 112 can have higher chip rate than Data-In-Signal 111, bit rate. In some exemplary embodiments, Second-Spreader 120 multiplies SS1-Signal 113 by a Second-Spreading-Sequence (2SpSeq) 122, thereby producing (generating) a Doubly-Spread-Spectrum-Signal (SS2-Signal) 123. It will be noted that 2SpSeq 122 has higher chip rate than that of SS1-Signal 113. It will also be noted that the chip rate of 2SpSeq 122 is much greater than the chip rate of 1SpSeq 112 and that either one of the multiplications can be regular multiplication, complex multiplication and any combination thereof, or the like.

Additionally, or alternatively, Tx 101 can further comprise a Frequency Converter 130 and a Carrier-Generator 131 used for modulating SS2-Signal 123 into an RF Doubly-Spread-Spectrum-Signal (RF-SS2-Signal) 132 in order to broadcast it with a Transmission-Amplifier (TxAmp) 140 coupled by an Antenna 141.

In some exemplary embodiments, First-Spreader 110 and Second-Spreader 120 can be electronically implemented using DSSS technique for encoding Data-In-Signal 111 and SS1-Signal 113 respectively. Both First-Spreader 110 and Second-Spreader 120 multiply their input stream signals by their corresponded spreading-sequences.

In some exemplary embodiments, a spreading-sequence can be an encoding series, such as pseudo-noise (PN) sequence signal, based on a Barker sequence; a Gold sequence; and any combination thereof, or the like. Additionally, or alternatively, the PN sequence of any one of the spreaders, e.g., First-Spreader 110 and Second-Spreader 120, can be a complex PN sequence. It will be noted that the PN sequence of de-spreaders/correlators implemented in receivers, such as Rx102 and Rx 300 (to be described in detail further below), can utilize a PN sequence that is either identical to the transmitter's PN, or a complex conjugate of the transmitter's PN sequence. It will also be noted that an outcome signal of spreaders, i.e., SS1-Signal 113 and SS2-Signal 123 can resemble bandlimited white noise.

In some exemplary embodiments, spreading-sequences, i.e., 1SpSeq 112 and 2SpSeq 122, can be generated by First-Spreader 110 and Second-Spreader 120, respectively. Additionally, or alternatively, either First-Spreader 110 and/or Second-Spreader 120 can be provided with spreading-sequences from an external resource such as an external device/processor. In some exemplary embodiments, Data-In-Signal 111 can be the input stream signal of First-Spreader 110, whereas SS1-Signal 113 (outcome of First-Spreader 110) can be the input stream signal of Second-Spreader 120, thereby cascading the Second-Spreader 120 to the First-Spreader 120.

In some exemplary embodiments, the function of First-Spreader 110 and Second-Spreader 120 is to alter the spectral bandwidth of their respective input signal to a wider spectral bandwidth at their output signal. It should be noted that, a ratio between a BW of the output signal and a BW of the input signal is defined as a processing gain (PG). Thus, PG of First-Spreader 110 (G1) is given by the BW of SS1-Signal 113 divided by the BW of Data-In-Signal 111. Similarly, PG of Second-Spreader 120 (G2) is given by the BW of SS2-Signal 123 divided the bandwidth of SS1-Signal 113.

It will be noted that Data-In-Signal 111 is characterized by high spectral density at a narrow bandwidth, e.g., BW 111'. While after encoding Data-In-Signal 111, by First-Spreader 110, the outcome of SS1-Signal 113, is lowered in spectral density over a wider bandwidth, e.g., BW 113'. Likewise, after spreading SS1-Signal 113, by Second-Spreader 120, the outcome of SS2-Signal 123 is further lowered in spectral density over an even wider bandwidth, e.g., BW 123'.

It will be appreciated that the product of G1 (PG of First-Spreader 110) by G2 (PG of Second-Spreader 120) significantly lowers the spectral energy over a very wide bandwidth, i.e., making the transmission: harder to detect and intercept; less interfering with other channels, and less vulnerable to jamming.

In some exemplary embodiments, the Tx 101 can be provided as an add-on device, configured to receive at its input (i.e., Data-In Signal 111) an RF signal from a transceiver, and then generate SS1-Signal 113 followed by SS2-Signal 123, which will be modulated and transmitted as an RF-SS2-Signal 132. Additionally, or alternatively, the RF-SS2-Signal 132 can be routed back to the transceiver for transmission.

In some exemplary embodiments, the Tx 101 can be provided as an add-on device, configured to receive (from a transceiver) a first-spread-spectrum signal, such, as SS1-Signal 113, and then generate SS2-Signal 123, which will be modulated to RF-SS2-Signal 132 for transmission by either Tx101 or the device.

In some exemplary embodiments, the Tx 101 of the wideband communication system of the present disclosure, is configured to perform a wireless communication transmitting method. In some exemplary embodiments, the transmitting method comprising: obtaining a Data-In-Signal 111 and spreading it, using First-Spreader 110, to SS1-Signal 113; followed by spreading the SS1-Signal 113, using Second-Spreader 120, to SS2-Signal 123.

Additionally, or alternatively, the transmitting method can also comprise modulating SS2-Signal 123, using Frequency Converter 130 and a Carrier-Generator 131 to RF-SS2-Signal 132, which can be transmitted by TxAmp 140 and an Antenna 141.

In some exemplary embodiments, 1SpSeq 112 and 2SpSeq 122 used, in the spreading process, by First-Spreader 110 and Second-Spreader 120 respectively, employ complex spreading-sequences; such as bi-phase spreading-sequence; polyphase spreading-sequence; and any combination thereof, or the like.

It will be noted that in some exemplary embodiments, 1SpSeq 112 and 2SpSeq 122 are identical. Thus, both First-Spreader 110 and Second-Spreader 120 can utilize the same spreading sequence in any given spreading process.

In some exemplary embodiments, Second-Spreader 120 can re-transmit a plurality of identical information replicas encapsulated in SS2 123 signal for improving Signal-to-Noise-Ratio (SNR) on the receiver end.

Figure 1B:
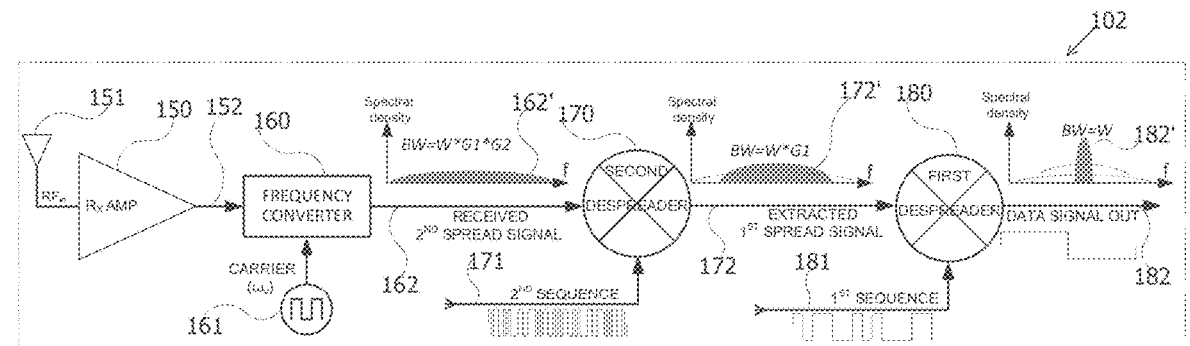
FIG. 1B shows a schematic block diagram of a receiver utilizing a cascaded de-spread-spectrum system, in accordance with some exemplary embodiments of the disclosed subject matter.

Reference is now made to FIG. 1B, showing a schematic block diagram of a receiver utilizing a cascaded de-spread-spectrum system, in accordance with some exemplary embodiments of the disclosed subject matter.

FIG. 1B depicts a receiver's cascaded de-spread-spectrum system implemented in a Receiver (Rx) 102 of the present disclosure. Rx 102 is a wireless receiver, designed to receive RF signals, having very high BW, and extract (decode) information, originated at the input signal of a transmitter, such as Data-In-Signal 111 of Tx 101, of FIG. 1A.

The Rx102 is adapted for decoding (correlating) high chip rate signals for the purpose of extracting information originated in an input signal, such as Data-in Signal 111 of FIG. 1A. The Rx 102 can be comprised of a Second-De-spreader 170 and a First-De-spreader 180, which is connected in series to Second-De-spreader 170 egress.

Additionally, or alternatively, Rx 102 can also comprise an RF Receiver Amplifier (RxAmp) 150 coupled by an Antenna 151 adapted to receive an RFin signal and amplify it to an RF Received-Doubly-Spread-Spectrum-Signal (RF-RSS2-Signal) 152. In addition, Rx 102 can further comprise a Frequency-Converter 160 and a Carrier-Generator 161 adapted to convert the RF-RSS2-Signal 152 into a Received-Doubly-Spread-Spectrum-Signal (RSS2-Signal) 162.

In some exemplary embodiments, Second-De-spreader 170 and First-De-spreader 180 are configured to de-spread RSS2-Signal 162 for extracting information originating from a spread-spectrum transmitter, such as Tx 101 of FIG.

1A. De-spreading RSS2-Signal 162 can comprise multiplying RSS2-Signal 162, by a Second-De-Spreading-Sequence (2DSpSeq) 171 with Second-De-spreader 170 for yielding an Extracted-First-Spread-Spectrum-Signal (ESS1-Signal) 172. Followed by multiplying ESS1-Signal 172, by a First-De-Spreading-Sequence (1DSpSeq) 181 with First-De-spreader 180 for yielding a Data-Out-Signal 182, i.e., reconstructed information originated in Tx 101, of FIG. 1A.

It will be noted that first and second de-spreading-sequences of Rx 102 are associated with corresponding spreading-sequences, i.e., first and second spreading-sequences, of the Tx101. In some exemplary embodiments, the de-spreading-sequences of the receiver are complex-conjugates of the spreading-sequences of the transmitter, i.e., 1DSpSeq 181 and 2DSpSeq 171 are complex-conjugates of 1SpSeq 112 and 2SpSeq 122 of FIG. 1A, respectively. It will also be noted that the de-spreading process of Second-De-spreader 170 and First-De-spreader 180 utilizes 2DSpSeq 171 and 1DSpSeq 181, respectively, for correlating RSS2-Signal 162 and ESS1-Signal 172 with the transmission. In some exemplary embodiments, correlating RSS2-Signal 162 with 2DSpSeq 171 can be performed for yielding a correlated signal from which the ESS1-Signal 172 is created. Additionally, Second-De-spreader 170 can be used for sampling the correlated signal within a correlation pulse width.

In some exemplary embodiments, Second-De-spreader 170 and a First-De-spreader 180 can be electronically implemented using DSSS technique for decoding RSS2-Signal 162 and ESS1-Signal 172 respectively.

In some exemplary embodiments, 2DSpSeq 171 and 1DSpSeq 181 used in the de-spreading process, by Second-De-spreader 170 and First-De-spreader 180 respectively, employ general complex de-spreading-sequences; such as bi-phase de-spreading-sequence; polyphase de-spreading-sequence; and any combination thereof, or the like.

It will be noted that in some exemplary embodiments, 1DSpSeq 181 and 2DSpSeq 171 are identical. Thus, both First-De-spreader 180 and Second-De-spreader 170 can utilize the same de-spreading sequence in any given de-spreading process.

In some exemplary embodiments, Second-De-spreader 170 can comprise a digital matched filter; a noncoherent-integrator; a peak (threshold) detector; a Phase-Locked-Loop (PLL), configured to assemble (extract) ESS1-signal out of RSS2-Signal 162. In some exemplary embodiments, RSS2-Signal 162 can be probed at a rate of W*G1*G2*K Hertz [Hz]. Thus 1/(W*G1*G2*K) seconds defines one probing time-shift (probing-cycle) out of a plurality of time-shifts in which RSS2-Signal 162 is probed. Where W is the bit rate, and K is the number of probs per chip. In some exemplary embodiments, the digital matched filter can be configured to generate correlation pulses by means of calculating a sum of multiplications of 2DSpSeq 171 by RSS2-Signal 162 for each probing time-shift. The noncoherent-integrator can be configured to perform a plurality of noncoherent integrations (typically, the number of noncoherent integrations can be G2*K) for probing time-shifts. The integration can be performed on probs separated by 1/(W*G1) seconds. Thereby performing the noncoherent integration for time-shifts that can accommodate a peak of the correlation pulse. Consequently, the peak detector searches for an outcome of an integration out of the plurality of integrations, that has the highest value outcome. Consequently, the PLL operating at the period of the correlation pulse (1/(W*G1) seconds), can be configured to lock on the peak detector output, thereby determining a synchronization area within boundaries of the correlation pulse.

In some exemplary embodiments, assembling the ESS1-signal comprises: at least one probing per chip of the RSS2-signal for each time-shift; generating the correlation pulse by calculating a sum of multiplications of 2DSpSeq 171 by the probing's outcome of each time-shift; performing a plurality of noncoherent integrations of the probing's outcome of each time-shift; searching for a highest value outcome of the noncoherent integrations; determining a synchronization area within boundaries of the correlation pulse.

In some exemplary embodiments, the digital-matched filter output is probed according to the PLL output. These probes can be defined as a correlated signal, i.e., ESS1-Signal 172.

As an example, assuming that G1=G2=20 db of Tx101 and a detection of Data-Out-Signal 182 prefers SNR of 10 db. Thus, the SNR of RSS2-Signal 162 can be 10−40=−30 dB and then, the Second-De-spreader 170 increases the SNR by 20 db to −10 db. Assuming the correlation peak detection, after noncoherent integration, have a high detection probability of 0.9 and a false detection probability of $10^{-6}$, then the required noncoherent integration gain will be 23 db to increase the SNR of the noncoherent integration result to 13 db. For the SNR of minus-infinity, the noncoherent integration gain is $\sqrt{N}$ where N is the number of sums. It can be determined that for an SNR of −10 db the noncoherent integration gain is $N^{0.63}$, and therefore, to obtain a gain of 23 dB or a factor of 200, the number of sums can be about 4500.

In some exemplary embodiments, First-De-spreader 180 comprises a digital matched filter (not shown) and a noise-riding-threshold-detector (not shown). Similarly, the digital matched filter of First-De-spreader 180 can be configured to generate correlation pulses by means of calculating a sum of multiplications of 1DSpSeq 181 by ESS1-Signal 172 for each sampling time-shift, typically 1/(W*G1) seconds. While the noise-riding-threshold-detector acts as a filter for seeking and extracting the correlation peaks.

Additionally, or alternatively, the Rx102 can utilize a serial search technique for determining optimal sampling timing of the correlation pulses. In some exemplary embodiments, Second-De-spreader 170 is configured to execute serial search and obtain a feedback from First-De-spreader 180 for each time-shift in the serial search until First-De-spreader 180 flags that the current time-shift provides samples of the correlation pulses that are adequate for further processing by the First-De-spreader 180.

The synchronization of Second-De-spreader 170 can require additional synchronization time beyond the synchronization time of First-De-spreader 180. Thus, in some exemplary embodiments, an additional synchronization sequence can be added, in accordance with the SNR for the detection of Data-Out-Signal 182.

As an example, for packet transmission, additional time can be needed for the Second-De-spreader 170 to complete its synchronization, namely, sampling the exact time of the correlation pulse before First-De-spreader 180 starts its usual synchronization. In some exemplary embodiments, additional transmission time can be allocated before First-De-spreader 180 receives ESS1-Signal 172 on which it can be synchronized.

Additionally, or alternatively, additional time can be added to the transmitted signal, which allows for synchronization of the First-De-spreader 180. The additional time doesn't affect the transmission, and it can also be acceptable for continuous transmission (non-packet transmission).

It will be noted that RSS2-Signal 162 is characterized by its very low spectral density across a very wide bandwidth, e.g., BW 162'. While after de-spreading RSS2-Signal 162 by Second-De-spreader 170 the outcome of ESS1-Signal 172 has higher spectral density over a narrower bandwidth, e.g., BW 172'. Likewise, after de-spreading ESS1-Signal 172, by First-De-spreader 180, the outcome Data-Out-Signal 182 has even higher spectral density over an even narrower bandwidth, e.g., BW 182'. It will be appreciated that the product of G2 (PG of Second-De-spreader 170) by G1 (PG of First-De-spreader 180) significantly increases the spectral energy over a very narrow bandwidth.

In some exemplary embodiments, the Rx 102 can be provided as an add-on device, configured to receive RF-RSS2-Signal 152 from a transceiver and demodulate it to RSS2-Signal 162. This can be followed by a two-step sequential de-spreading, first by Second-De-spreader 170 followed by First-De-spreader 180 for extracting the data represented by Data-Out-Signal 182. Additionally, or alternatively, Data-Out-Signal 182 can be routed back to the transceiver for further processing.

In some exemplary embodiments, the Rx 102 can be provided as an add-on device, configured to receive (from a transceiver) a demodulated signal, i.e., RSS2-Signal 162, and then conduct the two-step sequential de-spreading process using Second-De-spreader 170 followed by First-De-spreader 180 for extracting the data represented by Data-Out-Signal 182. Additionally, or alternatively, Data-Out-Signal 182 can be routed back to the transceiver for further processing.

In some exemplary embodiments, the Rx 102 can be provided as an add-on device, configured to obtain RSS2-Signal 162 from a transceiver and execute a de-spreading process using Second-De-spreader 170 for assembling the ESS1-Signal 172. This can be followed by routing the ESS1-Signal 172 back to the transceiver for completing the extracting process. Additionally, or alternatively, such add-on device can be configured to receive RSS2-RF-Signal 152 and demodulate it to RSS2-Signal 162.

In some exemplary embodiments of the disclosed subject matter, Tx101 (of FIG. 1A); Rx102; and combination thereof can be implemented and integrated into a wideband communication system/device.

In some exemplary embodiments, the Rx 102 of the wideband communication system of the present disclosure, is configured to perform a wireless communication receiving method. In some exemplary embodiments, the receiving method comprising: obtaining RSS2-Signal 162, either from Frequency-Converter 160 or from an external transceiver, and de-spreading it with Second-De-spreader 170, to ESS1-Signal 172. Followed by, de-spreading the ESS1-Signal 172 with First-De-spreader 180, to Data-Out-Signal 182.

In some exemplary embodiments, Frequency-Converter 160 obtains an RF-RSS2-Signal 152 from RxAmp 150 and utilizes Carrier-Generator 161 for demodulating RF-RSS2-Signal 152 into RSS2-Signal 162.

In some exemplary embodiments, Second-De-spreader 170 can be configured to obtain (receive) RSS2-Signal 162 that comprise a plurality of identical information replicas encapsulated in RSS2-Signal 162. Additionally, or alternatively, Second-De-spreader 170 can be also be configured to extract the plurality of information replicas encapsulated in the RSS2-Signal 162 for adjusting the Rx 102 to improve an SNR of Data-Out-Signal 182.

Figure 2:
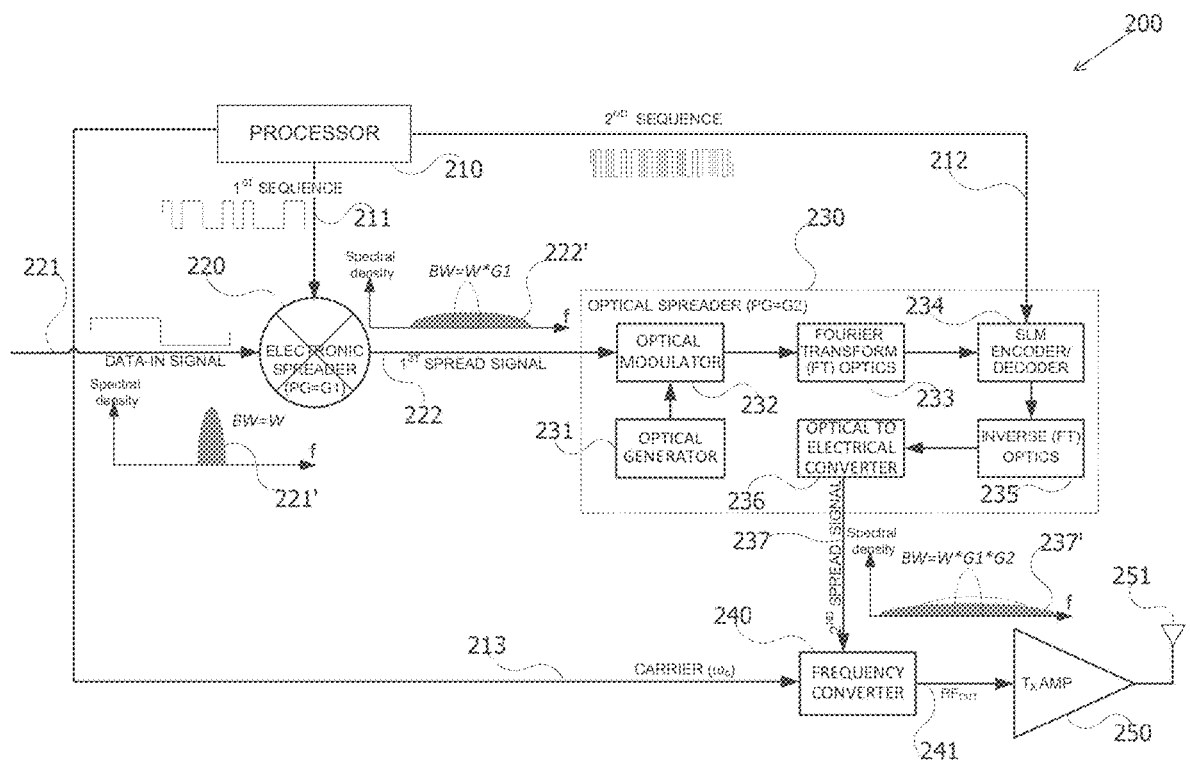
FIG. 2 shows a schematic block diagram of a transmitter utilizing another cascaded spread-spectrum system, in accordance with some exemplary embodiments of the disclosed subject matter.

Reference is now made to FIG. 2, showing a schematic block diagram of a transmitter utilizing another cascaded spread-spectrum system, in accordance with some exemplary embodiments of the disclosed subject matter.

FIG. 2 depicts a transmitter's cascaded spread-spectrum system implemented in a Transmitter (Tx) 200 of the present disclosure. Tx 200 is a wireless transmitter designed to encode information originating from the input signal of Tx 200. Tx 200 is also designed to transmit signals having very wide BW, e.g., 10 Giga Hz. Tx 200, can also be adapted for encoding high bitrate data signals.

In some exemplary embodiments, Tx 200 can comprise an Electronic-Spreader 220 (first-spreader); a Processor 210; an Optical-Spreader 230 (second-spreader); a Frequency Converter 240; and a Transmission-Amplifier (TxAmp) 250 coupled by an Antenna 251.

In some exemplary embodiments, Electronic-Spreader 220 multiplies a Data-In-Signal 221, comprising information to be transmitted, by a 1SpSeq 211, thereby producing an SS1-Signal 222. It will be noted that 1SpSeq 211 has higher chip rate than Data-In-Signal 221 bit rate.

Optical-Spreader 230 can be configured to multiply SS1-Signal 222 by a 2SpSeq 212, for generating a SS2-Signal 237. It will be noted that the bandwidth of SS2-Signal 237, e.g., BW237', is much greater than the bandwidth of SS1-Signal 222, e.g., BW222'.

In some exemplary embodiments, Tx 200 can utilize Frequency Converter 240 for modulating SS2-Signal 237 with a Carrier-Signal 213 to an RF-SS2-Signal 241 (RFout) in order to broadcast it by TxAmp 250 and antenna 251.

It will be noted that Data-In-Signal 221 is characterized by high spectral density at a narrow bandwidth, e.g., BW 221'. Spreading Data-In-Signal 221, by Electronic-Spreader 220, yields SS1-Signal 222, that is lowered in spectral density over a wider bandwidth, e.g., BW 222'. Likewise, spreading SS1-Signal 222, by Optical-Spreader 230, yields SS2-Signal 237, that is further lowered in spectral density over an even wider bandwidth, e.g., BW 237'.

It will be appreciated that the product of G1 (i.e., PG of Electronic-Spreader 220) by G2 (i.e., PG of Optical-Spreader 230) significantly lowers the spectral energy over a very wide bandwidth. Thereby, making the transmission: harder to detect and intercept; less interfering with other channels, and less vulnerable to jamming.

In some exemplary embodiments, Tx 200 can comprise a Processor 210 that can be configured to control and or generate 1SpSeq 211; 2SpSeq 212; Carrier-Signal 213; light pulses, by means of an Optical-generator 231; and any combination thereof, or the like. Thus, it will be appreciated that by controlling 1SpSeq 211, 2SpSeq 212, and the light pulses, Processor 210 can determine the processing gain, i.e., G1 and G2, as well as the BW of SS2-Signal 237.

Additionally, or alternatively, Processor 210 can be utilized to tune, with Carrier-Signal 213, the modulating frequency of Frequency Converter 240, thereby controlling Tx 200 broadcast frequency, i.e., RF-SS2-Signal 241.

In some exemplary embodiments, Tx 200 can utilize Processor 210 to perform methods such as depicted in FIG. 4. Processor 210 can be also utilized to perform computations needed by Tx 200 or any of its subcomponents. In some exemplary embodiments of the disclosed subject matter, Processor 210 can comprise an Input Output (I/O) module (not shown). The I/O module can be utilized as an interface to communicate information and instructions between Processor 210 and an external computer; other transmitters; and any combination thereof, or the like.

In some exemplary embodiments, Processor 210 can comprise a memory module (not shown). The memory module can be comprised of volatile and/or non-volatile memories, based on technologies such as semiconductor, magnetic, optical, flash, a combination thereof, or the like.

The memory module can retain program code operative to cause Processor 210 to perform acts associated with any of the steps shown in FIG. 4. In some exemplary embodiments, the memory module (not shown) of Processor 210 can be used to retain encoding information; data representations of a plurality of different spreading-sequences; and a combination thereof, or the like.

It will be noted that Processor 210 can be an integral component of Tx 200. Additionally, or alternatively, Processor 210 can be equipped within an adjacent transceiver, which is configured to provide the Tx 200 with signals, such as 1SpSeq 211; 2SpSeq 212; and Carrier-Signal 213.

In some exemplary embodiments, Tx 200 can be provided as an add-on device, configured to obtain at its input (i.e., Data-In-Signal 221) an RF-out signal (of a transceiver), and then generate SS1-Signal 222 followed by SS2-Signal 237, which will be modulated and transmitted as RF-SS2-Signal 241. Additionally, or alternatively, RF-SS2-Signal 241 can be routed back to the transceiver for transmission.

In some exemplary embodiments, Optical-Spreader 230 can be comprised of an Optical-generator 231; an Optical-Modulator 232; Fourier Transform optics (FT-Optics) 233; a Spatial Light Modulator (SLM) 234; an Inverse-Fourier-Transform-Optics (IFT-Optics) 235; and an Optical to Electrical Converter (O2E-Converter) 236.

Optical-generator 231 can be an optical pulse (flash of light) generator configured to emit periodic light pulses that can be emitted, for example by a Laser based optical-generator, in a range of picoseconds. In some exemplary embodiments, the pulse width (duty-cycle) is approximately ten to thousand times smaller than the cycle of the pulse. It will also be noted that Processor 210 can be used to control the optical modulation of Optical-Modulator 232 by means of Optical-generator 231 e.g., by controlling the pulse width and cycle of the Laser based optical-generator, such as Optical-generator 231.

Optical-Modulator 232 can be a Mach-Zehnder modulator or any similar type of electro-optical device having an interferometric structure made from a material with a strong electro-optic effect, such as Lithium Niobate (LiNbO3); Gallium Arsenide (GaAs); Indium Phosphide (InP); and any combination thereof, or the like. In some exemplary embodiments, applying an electric field, i.e., SS1-Signal 222, to Optical-Modulator 232 input changes optical path lengths resulting in phase modulation of light entering, by Optical-generator 231, the Optical-Modulator 232 optical input. In some exemplary embodiments, the Optical-Modulator 232 can be viewed as a modulator or as a multiplier configured to convert SS1-Signal 222 to a time-domain-optical-signal.

FT-Optics 233 can be comprised of a grating and one or more Fourier lenses, configured as an optical-signal processing component. In some exemplary embodiments, FT-Optics 233 can be utilized for performing a time to spatial frequency conversion. Viz. converting the time-domain-optical-signal to a frequency-domain-optical-signal.

In some exemplary embodiments, SLM 234 is an electro-optical component, based for example on liquid crystal technology, that spatially varies (modulates) a light beam by controlling its transparency. SLM 234 can modulate light beam intensity and light beam phase simultaneously. In some exemplary embodiments, SLM 234 can be utilized as spatial light modulator (encoder) for encoding spectrum of optical signals at its entrance (input) in accordance with a preregistered spreading-sequence.

It will be noted that SLM 234 of Tx 200 can be configured as an SLM-encoder utilized to encode the frequency-domain-optical-signal.

In some exemplary embodiments, the encoding involves scrambling the spectrum of SLM 234 input-signal through complex multiplication of the frequency components of the SLM's 234 input signal by a spreading-sequence. For example, the spreading-sequence can be a general complex spreading-sequence; a bi-phase spreading-sequence (e.g., Barker codes, m-sequences, and the like); a polyphase spreading-sequence (e.g., Frank codes, P4-codes, and the like); and any combination thereof, or the like.

In some exemplary embodiments, the time-domain-optical-signal passes through FT-Optics 233 that comprises a grating and a lens. The time-domain-optical-signal (collimated light) is diffracted by the grating into a plurality of spectral components that are collected and focused by the lens. At the focal plane of the lens, the plurality of spectral components of the optical-signal are linearly spatially separated. It will be noted that SLM 234 is positioned at the focal plane of the lens where these spatially separated spectral components (of the optical-signal) are passing (traversing) through at least one row of elements (pixels) of SLM 234 which contains the elements of a distinct spreading-sequence, thereby encoding the spectral components by the corresponding elements of the distinct spreading-sequence. For example, with a binary spreading-sequence for bits equal to 1 the phases of the corresponding pixels of SLM 234 are set to $\pi$ radians, and for bits equal to 0 the phases are set to 0 radians, thereby shifting the phase of the corresponding spectral component by $\pi$ or 0 radians respectively. Additionally, or alternatively, the amplitude of the spectral components can be controlled by setting the amplitude of the corresponding element of the spreading-sequence, thereby controlling the gain of the spectral components of the optical-signal.

IFT-Optics 235 can be comprised of one or more Fourier lenses and a grating, configured as optical-signal processing components. In some exemplary embodiments, IFT-Optics 235 can be utilized for performing spatial frequency to time conversion of its input optical-signal. Hence reassembling the different encoded spectral components into a single collimated output beam in the time-domain, which will be the basis of doubly spread spectrum signal.

O2E-Converter 236 can be a wide-band converter designed to perform optical to electrical conversion of optical-signals to measurable electrical signals. In some exemplary embodiments, the O2E-Converter 236 can be a bi-directional converter; hence it can be used as electrical to optical converter as well. It will be noted that the O2E-Converter 236 used in the present disclosure can be rated for sub-nanoseconds duration signals.

In some exemplary embodiments, optical pulses generated by Optical-generator 231 can be used for sampling SS1-Signal 222 (in the time-domain), which consequently yields a time-domain SS1-optical-signal. The time-domain SS1-optical-signal can be mathematically viewed as a multiplication of SS1-Signal 222 by the optical pulses (of Optical-generator 231) in the time-domain. In some exemplary embodiments, the time-domain SS1-optical-signal traverses through FT-Optics 233 in order to convert it to the frequency-domain, thereby yielding a frequency-domain-optical-signal.

In some exemplary embodiments, the frequency-domain-optical-signal that egress the FT-Optics 233 enters SLM 234, where it is encoded in accordance with second-spreading-sequence for yielding a frequency-domain-encoded-optical-signal. It will be appreciated that SLM 234 (SLM-encoder) can comprise at least one, pre-registered, second-spreading-sequence, provided via 2SpSeq 212.

Additionally, or alternatively, encoding the frequency-domain-optical-signal with 2SpSeq 212 can comprise pre-emphasizing the frequency-domain-optical-signal. Pre-emphasizing the frequency-domain-optical-signal can be implemented by adjusting the elements of pre-registered 2SpSeq 212 in the SLM 234 for higher gain intensities and/or predetermined phases for spatial frequency segments related to higher frequencies, in order to compensate for increased attenuation at high frequencies parts of the signal.

It will be appreciated that 2SpSeq 212 is used for providing SLM 234 with one or a plurality of spreading-sequences, which will be utilized for encoding the optically-modulated input of SLM 234. It will be noted that SLM 234 can be a matrix having columns (first dimension) and rows (second dimension), wherein each row contains elements of a single sequence.

It will be noted that in some exemplary embodiments, 1SpSeq 211 and 2SpSeq 212 are identical. Thus, both Electronic-Spreader 220 and Optical-Spreader 230 can utilize the same spreading sequence in any given spreading process.

In some exemplary embodiments, the spreading-sequences can be registered to SLM 234, and altered from time to time. It will be noted that the registration time can take up to a few milliseconds.

Additionally, or alternatively, the plurality spreading-sequences can be registered to SLM 234 at the same time, utilizing a second dimension of the SLM 234, wherein each sequence of the plurality of sequences can be instantly selected, as desired, by Processor 210. The selection of the sequence is performed for example by an optical device (such as a mirror or an electro-optic beam deflection device, or the like) which deflects the light beam to the appropriate area in the SLM in the second dimension. Alternatively, a bank of Optical Heterodyne Detectors will be placed to receive all possible results associated with all spreading-sequences and appropriate detector output will be selected.

In some exemplary embodiments, the frequency-domain-encoded-optical-signal, i.e., output of the SLM-encoder, can be converted by IFT-Optics 235 to yield a time-domain-encoded-optical-signal. Subsequently, time-domain-encoded-optical-signal can be converted by O2E-Converter 236 for yielding the SS2-Signal 237.

In some exemplary embodiments, Tx 200 can be provided as an add-on device, configured to receive (from a transceiver) a first-spread-spectrum signal, such as SS1-Signal 222, and then generate, with Optical-Spreader 230, the SS2-Signal 237, which can be either modulated to RF-SS2-Signal 241 and transmitted by TxAmp 250, or routed back to the transceiver for transmission. That is to say that in some exemplary embodiments, such add-on device can only incorporate Optical-Spreader 230 and connections to the transceiver.

In some exemplary embodiments of the disclosed subject matter, Tx200 can be implemented and integrated into a wideband communication system/device.

In some exemplary embodiments, Optical-Spreader 230 can re-transmit a plurality of identical information replicas encapsulated in SS2 237 signal for improving SNR on the receiver end.

Referring now to FIG. 3, there is shown a schematic block diagram of a receiver utilizing another cascaded de-spread-spectrum system, in accordance with some exemplary embodiments of the disclosed subject matter.

FIG. 3 depicts a receiver's cascaded spread-spectrum system implemented in a Receiver (Rx) 300 of the present disclosure. In some exemplary embodiments, Rx 300 can be a wireless receiver, designed to receive RF signals and reconstruct (decode) information, originated at the input signal of a transmitter, such as Data-In-Signal 221 of Tx 200, of FIG. 2.

In some exemplary embodiments, Rx 300 can comprise an Optical-Correlator 330 (second de-spreader) and an Electronic-De-Spreader 320 (first de-spreader) that is connected via a Filter 332 in series to Optical-Correlator 330 egress.

Additionally, or alternatively, Rx 300 can further comprise an RF input amplifier (RxAmp) 350 coupled by Antenna 351 that are adapted to amplify received signals into an RF-RSS2-Signal 352; and a Frequency-Converter 340 used for demodulating RF-RSS2-Signal 352, to an RSS2-Signal 341.

In some exemplary embodiments, a process of information extraction from RSS2-Signal 341 can comprise correlating RSS2-Signal 341 with a 2DSpSeq 312 using Optical-Correlator 330, which yields an ESS1-Signal 333, followed by Multiplying ESS1-Signal 333, by a 1DSpSeq 311, using Electronic-De-Spreader 320, which yields a Data-Signal-Out 321.

It will be noted that first and second de-spreading-sequences of Rx 300 are associated with a corresponding spreading-sequences, i.e., first and second spreading-sequences, of the Tx 200. In some exemplary embodiments, the de-spreading-sequences of Rx 300 are a complex-conjugate of the spreading-sequences of Tx 200, i.e., 1DSpSeq 311 and 2DSpSeq 312 are respectively equal to the complex-conjugate of 1SpSeq 211 and 2SpSeq 212 of FIG. 2. Additionally, or alternatively, 1DSpSeq 311 and 2DSpSeq 312 are respectively equal to the complex-conjugate of 1SpSeq 112 and 2SpSeq 122 of FIG. 1A.

It will be noted that RSS2-Signal 341 is characterized by its very low spectral density across a very wide bandwidth, e.g., BW 341'. While after correlating and filtering the RSS2-Signal 341, by Optical-Correlator 330 and Filter 332, the outcome of ESS1-Signal 333, has higher spectral density over a narrower bandwidth, e.g., BW 333'. Likewise, after de-spreading ESS1-Signal 333, by Electronic-De-Spreader 320, the outcome, Data-Out-Signal 321 has even higher spectral density over an even narrower bandwidth, e.g., BW 321'.

In some exemplary embodiments, Rx 300 can comprise a Processor 310 that can be configured to control and generate 1DSpSeq 311; 2DSpSeq 312; Carrier-Signal 313 and any combination thereof, or the like. Thus, it will be appreciated that by controlling 1DSpSeq 311 and 2DSpSeq 312 Processor 310 controls the correlation process in which the data is reconstructed (extracted). Additionally, or alternatively, Processor 310 can be utilized to tune, with Carrier-Signal 313, the demodulating frequency of the Frequency Converter 340, thereby controlling Rx 300 reception frequency, i.e., RSS2-Signal 341.

In some exemplary embodiments, Rx 300 can utilize Processor 310 to perform methods such as depicted in FIG. 5. Processor 310 can be also utilized to perform computations needed by Rx 300 or any of its subcomponents. In some exemplary embodiments of the disclosed subject matter, Processor 310 can comprise an I/O module (not shown). The I/O module can be utilized as an interface to communicate information and instructions between Processor 310 and an external computer; other transmitters, such as Tx 200; and any combination thereof, or the like.

In some exemplary embodiments, Processor 310 can comprise a memory module (not shown). The memory module can be comprised of volatile and/or non-volatile memories, based on technologies such as semiconductor, magnetic, optical, flash, a combination thereof, or the like. The memory module (not shown) can retain program code operative to cause Processor 310 to perform acts associated with any of the steps shown in FIG. 5. In some exemplary embodiments, the memory module (not shown) of Processor 310 can be used to retain encoding information; data representations of a plurality of different de-spreading-sequences; and a combination thereof, or the like.

It will be noted that Processor 310 can be an integral component of Rx 300. Additionally, or alternatively, Processor 310 can be equipped within an adjacent transceiver, which can be configured to provide the Rx 300 with signals, such as 1DSpSeq 311; 2DSpSeq 312; and Carrier-Signal 313.

In some exemplary embodiments, Optical-Correlator 330 can be comprised of: Optical-generator 231; Optical-Modulator 232; FT-Optics 233; SLM 234; IFT-Optics 235; O2E-Converter 236; a Noncoherent-Integrator 335; and a Pulse Detector 336.

In some exemplary embodiments, Optical-generator 231, of Optical-Correlator 330, can be an optical-generator, such as a continuous wave Laser based optical-generator.

Optical-Modulator 232 can be a Mach-Zehnder modulator or any similar type of electro-optical device having an interferometric structure made from a material with a strong electro-optic effect, such as LiNbO3; GaAs; InP; or any combination thereof, or the like. In some exemplary embodiments, applying an electric field to Optical-Modulator 232 input, i.e., with RSS2-Signal 341, changes optical path lengths resulting in phase modulation of light entering Optical-Modulator 232 from Optical-generator 231, thereby converting the RSS2-Signal 341 to a time-domain optical-signal. In some exemplary embodiments, the output of Optical-Modulator 232 can be viewed as a modulator or as a multiplier. It will also be noted that Processor 310 can be used to control the optical modulation of Optical-Modulator 232 by means of Optical-generator 231.

FT-Optics 233 can be comprised of a grating and one or more Fourier lenses configured as an optical-signal processing component. In some exemplary embodiments, FT-Optics 233 can be utilized for performing a time-to-spatial frequency conversion of the time-domain optical-signal into a frequency-domain-optical-signal.

In some exemplary embodiments, SLM 234; is an electro-optical component, based for example on liquid crystal technology, that spatially varies (modulate) a light beam by controlling its transparency. SLM 234 can modulate light beam intensity; light beam phase and simultaneously a combination thereof. In some exemplary embodiments, SLM 234, of Rx 300, can be configured as an SLM-decoder utilized to decode the encoded spectrum at its input, e.g., frequency-domain-optical-signal. It will be noted that SLM 234 of Rx 300, i.e., the SLM-decoder is utilized to decode the frequency-domain-optical-signal to a frequency-domain-decoded-optical-signal.

In some exemplary embodiments, the time-domain-optical-signal (collimated light) passes through the grating and lenses of FT-Optics 233 signal where it is diffracted into a plurality of spectral components that are collected and focused by a lens. At the focal plane of the lens, the spectral components of the optical-signal are linearly spatially separated. It will be noted that SLM 234 is positioned at the focal plane of the lens where these spatially separated spectral components, of the time-domain-optical-signal, are passing through at least one row of elements (pixels) of the SLM 234. In some exemplary embodiments, the elements correspond to a distinct spreading-sequence, thereby decoding the spectral components by the corresponding elements of the distinct de-spreading-sequence. For example, with a binary spreading-sequence for bits equal to 1 the phases of the corresponding pixels of SLM 234 are set to $\pi$ radians, and for bits equal to 0 the phases are set to 0 radians, thereby shifting the phase of the corresponding spectral component by $\pi$ or 0 radians respectively. Additionally, or alternatively, an amplitude of each spectral component can be controlled by setting the amplitude of the corresponding element of the spreading-sequence, thereby controlling the gain of each spectral component of the optical-signal.

It will be appreciated that SLM 234, of Rx 300, is utilized for decoding, using at least one 2DSSeq 312 to decode the frequency-domain-optical-signal into a frequency-domain-decoded-optical-signal. In some exemplary embodiments, SLM 234 can be utilized for filtering interference from the frequency-domain-optical-signal.

IFT-Optics 235 can be comprised of one or more Fourier lenses and a grating configured as optical-signal processing components. In some exemplary embodiments, IFT-Optics 235 can be utilized for performing spatial frequency to time conversion of its input optical-signal by reassembling the different decoded spectral components into a single collimated output beam in the time-domain, thereby transforming a frequency-domain-decoded-optical-signal to a time-domain-decoded-optical-signal.

O2E-Converter 236 can be a wide-band converter designed to convert optical-signals to measurable electrical signals. In some exemplary embodiments, the O2E-Converter 236 can be an Optical Heterodyne Detector that converts an optical-signal to an electrical signal while preserving the phase. It will be noted that O2E-Converter 236 of the present disclosure can be rated for nanoseconds duration signals for performing optical to electrical conversion of an optically sampled time-domain-correlated-optical-signal (to be described in detail further below) to a correlated electrical signal, i.e., ESS1 333.

In some exemplary embodiments, Noncoherent-Integrator 335 can be configured to optically probe the outcoming time-domain decoded optical-signal from IFT-Optics 235, and to derive a plurality of integrations (typically, the number of integrations is G2*K), each shifted by a time-shift with respect to the previous probing. In some exemplary embodiments, the outcoming time-domain decoded optical-signal can be optically probed at a rate of W*G1*G2*K Hz. [Hz]. Thus 1/(W*G1*G2*K) seconds defines one optical-probing time-shift (cycle) out of a plurality of time-shifts in which time-domain decoded optical-signal can be optically probed. Where W is the bit rate of 2DSSeq 312, and K is an optical-probing factor. The noncoherent integration can be performed on probes separated by 1/(W*G1) seconds, thereby performing the noncoherent integration for time-shifts that can accommodate the peak of the correlation pulse. Pulse Detector 336 can be configured to optically sample the outcoming time-domain-decoded-optical-signal from IFT-Optics 235. In some exemplary embodiments, Pulse Detector 336 can comprise a peak (threshold) detector (not shown) used to detect pulses generated by Noncoherent-Integrator 335; and a PLL, operating at the period of the correlation pulse (1/(W*G1) seconds). Therefore, the PLL can be used to lock on the period of the detected noncoherently integrated pulses thus providing Pulse Detector 336 an indication for selecting the optically sampled correlation pulses at the outcoming time-domain-decoded-optical-signal, thereby determining a synchronization area within boundaries of the correlation pulse, which enables optically-sampling the time-domain-decoded-optical-signal within the correlation pulse width for yielding the optically sampled-time-domain-correlated-optical-signal.

Additionally, or alternatively, the Rx 300 can utilize a serial search technique for determining an optimal optical sampling timing of the correlation pulses. In some exemplary embodiments, Optical correlator 330 can be configured to execute a serial search and obtain a feedback from Electronic De-spreader 320 for each time-shift in the serial search until Electronic De-spreader 320 flags that the current time-shift provides samples of the correlation pulses that are adequate for further processing by the Electronic De-spreader 320.

In some exemplary embodiments, Optical correlator 330 can extend its synchronization time, in accordance with the SNR, beyond synchronization time needed by Electronic De-spreader 320.

As an example, for packet transmission, additional time can be needed for the Optical correlator 330 to complete its synchronization, namely, sampling the exact time of the correlation pulse before Electronic De-spreader 320 starts its usual synchronization. In some exemplary embodiments, additional synchronization transmission time can be allocated before Electronic De-spreader 320 receives the ESS1-Signal 333 on which it will be synchronized.

Additionally, or alternatively, additional time can be added to the transmitted signal, which allows for synchronization of the Electronic De-spreader 320. The additional time doesn't affect the reception, and this can also be acceptable for continuous reception (non-packet transmission).

In some exemplary embodiments, the optical-signal generated by Optical-generator 231 is used for modulating RSS2-Signal 341 (in the time-domain), which consequently yields a time-domain optical-signal. The time-domain optical-signal can be mathematically viewed as a multiplication of RSS2-Signal 341 by the optical-signal (of Optical-generator 231) in the time-domain. In some exemplary embodiments, the time-domain optical-signal traverses through FT-Optics 233 in order to be converted to the frequency-domain, thereby yielding the frequency-domain-optical-signal. In some exemplary embodiments, the frequency-domain-optical-signal that egress the FT-Optics 233 enters SLM 234, where its spectrum shall be decoded in accordance with 2DSpSeq 312 that was pre-registered in SLM 234 and thereby yielding a frequency-domain-decoded-optical-signal.

It will be appreciated that 2DSpSeq 312 is used for providing SLM 234 with at least one de-spreading-sequence utilized for decoding the frequency-domain-optical-signal. In some exemplary embodiments, the de-spreading-sequences can be registered to SLM 234, and altered from time to time. It will be noted that the registration time can take up to a few milliseconds. Additionally, or alternatively, the plurality of de-spreading-sequence can be registered to SLM 234 at the same time, utilizing a second dimension of the SLM 234, wherein, consequently, each sequence of the plurality of sequences can be instantly selected, as desired, by Processor 310. The selection of the sequence is performed for example by an optical device (such as a mirror, or an electro-optic beam deflection device, or the like) which deflects the light beam to the appropriate area in the SLM in the second dimension. Alternatively, a bank of Optical Heterodyne Detectors will be placed to receive results associated with the sequences and appropriate detector output will be selected.

In some exemplary embodiments, the frequency-domain-decoded-optical-signal, i.e., SLM 234 outcome, can be converted by IFT-Optics 235 to a time-domain-decoded-optical-signal.

In some exemplary embodiments, Pulse Detector 336 and Noncoherent-Integrator 335 mutually produce the correlation pulses that are used to decode (reconstruct) the original first spread-spectrum from the time-domain-decoded-optical-signal. In some exemplary embodiments, Pulse Detector 336 yields a First-Extracted-Spread-Spectrum (ESS1)-optical-signal followed by converting it by O2E-Converter 236 to electrical representation, i.e., ESS1-Signal 333, which can undergo analog filtration by Filter 332.

In some exemplary embodiments, the Rx 300 can be provided as an add-on device, configured to receive RF-RSS2-Signal 352 from a transceiver and demodulate it to RSS2-Signal 341. This can be followed by a two-step sequential de-spreading, first by Optical-Correlator 330 followed by Electronic-De-Spreader 320 for reconstructing (extracting) the data that is represented by Data-Out-Signal 321. Additionally, or alternatively, Data-Out-Signal 321 can be routed back to the transceiver for further processing.

It will be noted that in some exemplary embodiments, 1DSpSeq 311 and 2DSpSeq 312 are equal. Thus, both Electronic-De-Spreader 320 and Optical-Correlator 330 can utilize the same de-spreading sequence in any given de-spreading process.

In some exemplary embodiments, the Rx 300 can be provided as an add-on device, configured to receive (from a transceiver) a demodulated signal, i.e., RSS2-Signal 341, and then generate with Optical-Correlator 330 and Filter 332 the ESS1-Signal 333, which can be routed back to the transceiver for completing the next de-spreading step and the reception process. That is to say that, in some exemplary embodiments, such add-on device can incorporate Optical Correlator 330 and connections to the transceiver.

Additionally, or alternatively, the add-on device depicted above can comprise an Electronic-De-Spreader 320 configured to process the ESS1-Signal 333 for reconstructing the data that is represented by Data-Out-Signal 321. In turn, Data-Out-Signal 321 can be routed back to the transceiver for further processing.

In some exemplary embodiments of the disclosed subject matter, Rx300 can be implemented and integrated into a wideband communication system/device.

In some exemplary embodiments, Rx 300 can be configured to obtain (receive) RSS2-Signal 341 that comprise a plurality of identical information replicas encapsulated in RSS2-Signal 341. Additionally, or alternatively, Rx 300 can be also configured to extract the plurality of information replicas encapsulated in the RSS2-Signal for the purposes of adjusting the Rx 300, leading for improving the SNR of the RSS2-Signal.

Reference is now made to FIG. 4 showing a flowchart diagram of a transmitting method for the transmitter of FIG. 2, in accordance with some exemplary embodiments of the disclosed subject matter.

In step 401, an SS1-Signal can be obtained. In some exemplary embodiments, the SS1-Signal (such as SS1-Signal 113 of FIG. 1A; SS1-Signal 222, of FIG. 2; and an external SS1-Signal, generated by an external transceiver) can be obtained by a second spreader (such as Optical-Spreader 230 of FIG. 2, and Second-Spreader 120 of FIG. 1A).

In step 402, the SS1-Signal can be converted to the optical domain. In some exemplary embodiments, Optical-generator 231, of FIG. 2, and Optical-Modulator 232, of FIG. 2, are mutually used for sampling and optically modulating SS1-Signal in order to produce a SS1-Optical-Signal.

In step 403, the SS1-Optical-Signal can be transformed to the frequency-domain-optical-signal. In some exemplary embodiments, FT-Optics 233, of FIG. 2, can be used for transforming SS1-Optical-Signal that is characterized by a plurality of spectral components.

In step 404, the frequency-domain-optical-signal can be encoded using an SLM-encoder. In some exemplary embodiments, SLM 234, of FIG. 2 that is configured as SLM-encoder encodes frequency-domain-optical-signal in accordance with a spread sequence that was pre-registered in SLM 234, of FIG. 2, by means of 2SpSeq 212, of FIG. 2, thereby yielding a frequency-domain-encoded-optical-signal.

In step 405, the frequency-domain-encoded-optical-signal can be transformed to time-domain-encoded-optical-signal. In some exemplary embodiments, IFT-Optics 235, of FIG. 2, can be used for transforming the frequency-domain-encoded-optical-signal to the time-domain.

In step 406, the time-domain-encoded-optical-signal can be converted to an electrical signal. In some exemplary embodiments, O2E-Converter 236, of FIG. 2, can be utilized for converting the time-domain-encoded-optical-signal to SS2-electrical signal, such as SS2-Signal 237, of FIG. 2.

In step 407 the time-domain SS2-Signal, such as SS2-Signal 237 (of FIG. 2) and SS2-Signal 123 (of FIG. 1A) can be modulated and transmitted. In some exemplary embodiments, a frequency converter, such as Frequency Converter 240, of FIG. 2; and the Frequency Converter 130, of FIG. 1A, can be utilized (respectively) for modulating SS2-Signal 237 into RF-SS2-Signal 241 (of FIG. 2) and SS2-Signal 123 into RF-SS2-Signal 132 (of FIG. 1A). Additionally, RF-SS2-Signal 241 (of FIG. 2) and RF-SS2-Signal 132 (of FIG. 1A) can be, respectively, transmitted by TxAmp 250 (of FIG. 2) and TxAmp 140 (of FIG. 1A).

It is to be further noted that, with reference to FIG. 4, some of the blocks can be integrated into a consolidated block or can be broken down to a few blocks and/or other blocks can be added. Furthermore, in some cases, the blocks can be performed in a different order than described herein. It is to be further noted that some of the blocks are optional. It will be also noted that whilst the flow diagram is described also with reference to the system elements that realizes them, this is by no means binding, and the blocks can be performed by elements other than those described herein.

Referring now to FIG. 5, there is shown a flowchart diagram of a receiving method for the receiver of FIG. 3, in accordance with some exemplary embodiments of the disclosed subject matter.

In step 501, an RF-RSS2-Signal can be received and demodulated. In some exemplary embodiments, the RF-RSS2-Signal, such as RF-RSS2-Signal 352 (of FIG. 3) and RF-RSS2-Signal 152 (of FIG. 1B) can be received and amplified by RxAmp 350 (of FIG. 3) and RxAmp 150 (of FIG. 1B), respectively. In some exemplary embodiments, the RF-RSS2-Signal can be demodulated to an RSS2-Signal by Frequency Converter 240 (of FIG. 3), or Frequency-Converter 160, (of FIG. 1B), which are used to demodulate RF-RSS2-Signal 352 (of FIG. 3) and RF-RSS2-Signal 152 (of FIG. 1B) into RSS2-Signal 341 (of FIG. 3) and RSS2-Signal 162 (of FIG. 1B), respectively.

In step 502, the RSS2-Signal can be converted. In some exemplary embodiments, Optical-generator 231 and Optical-Modulator 232 (of FIG. 3) can be mutually used for optically modulating the SS2-Signal to an optical-signal.

In step 503, the optical-signal can be transformed to the frequency-domain. In some exemplary embodiments, FT-Optics 233, (of FIG. 3) can be used for transforming the optical-signal from the time-domain to a frequency-domain-optical-signal.

In step 504, the frequency-domain-optical-signal can be decoded using a Spatial Light Modulator (SLM). In some exemplary embodiments, an SLM, such as SLM 234 (of FIG. 3), decodes the frequency-domain-optical-signal, in accordance with de-spreading-sequence by 2DSpSeq 312. In some exemplary embodiments, the de-spreading-sequences can be pre-registered in SLM 234, of FIG. 3, by means of 2DSpSeq 312, of FIG. 3, thereby yielding a frequency-domain-decoded-optical-signal. Additionally, or alternatively, the RSS2-Signal can be decoded using DSSS decoding.

In step 505, frequency-domain-decoded-optical-signal can be converted to the time-domain. In some exemplary embodiments, IFT-Optics 235 (of FIG. 3) can be used for converting the frequency-domain-decoded-optical-signal to time-domain-decoded-optical-signal. In some exemplary embodiments, Pulse Detector 336 and Noncoherent-Integrator 335 (of FIG. 3) are configured to mutually produce correlation pulses utilized to extract an original first-spread-spectrum signal. In some exemplary embodiments, Pulse Detector 336 (of FIG. 3) yields an optically sampled time-domain correlated optical-signal.

In step 506, the optically sampled time-domain correlated optical-signal can be converted to a correlated electrical signal. In some exemplary embodiments, O2E-Converter 236 (of FIG. 3) can be utilized for converting the optically sampled time-domain correlated optical-signal to a correlated electrical signal. Additionally, or alternatively, the correlated electrical signal can be filtered by an analog filter, such as Filter 332 (of FIG. 3), thereby yielding a first extracted spread spectrum (ESS1) electrical signal such as ESS1-Signal 333 (of FIG. 3).

In step 507, the time-domain correlated electrical signal, i.e., a ESS1 electrical signal can be de-spread by a supplementary correlator to a baseband signal. In some exemplary embodiments, the ESS1 electrical signal can undergo a second stage de-spreading process with a supplementary correlator, such as First-De-spreader 180 (of FIG. 1B); and Electronic-De-Spreader 320 (of FIG. 3) that yield Data-Out-Signal 182 (of FIG. 1B) and Data-Signal-Out 321 (of FIG. 3), respectively.

It is to be further noted that, with reference to FIG. 5, some of the blocks can be integrated into a consolidated block or can be broken down to a few blocks and/or other blocks can be added. Furthermore, in some cases, the blocks can be performed in a different order than described herein. It is to be further noted that some of the blocks are optional. It will be also noted that whilst the flow diagram is described also with reference to the system elements that realizes them, this is by no means binding, and the blocks can be performed by elements other than those described herein.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based can readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

What is claimed is:

1. A method for spreading of received signals, the method comprising:
   generating a first-spread-spectrum-signal (SS1-signal), wherein the SS1-signal is generated by performing a first spreading of a data signal, by a first spreader, wherein the frequency bandwidth (BW) of the SS1-signal is greater than the frequency BW of the data signal;
   converting the SS1-signal into an optical SS1-signal, using an optical second spreader;
   generating a doubly-spread-spectrum optical signal (optical SS2-signal) from the optical SS1-signal, using the optical second-spreader, wherein the frequency BW of the optical SS2-signal is greater than the frequency BW of the SS1-signal; and
   generating a corresponding RF signal (RSS2-signal) from the optical SS2-signal, wherein the frequency BW of the RSS2-signal is greater than the frequency BW of the SS1-signal,
wherein the optical SS2-signal is generated by having the optical SS1-signal manipulated by the optical second spreader, using a spreading-sequence out of at least one spreading-sequence, and
wherein the RSS2-signal is generated for transmitting of the RSS2-signal via a wireless communication network.

2. The method of claim 1, wherein said generating of the optical SS2-signal is done by:
   converting the SS1-signal to an optical SS1-signal by sampling the SS1-signal with optical pulses emitted by an optical-generator into an optical-modulator that receives the SS1-signal;
   transforming the optical SS1-signal to a frequency-domain-optical-signal characterized by a plurality of spectral components;
   encoding the frequency-domain-optical-signal, by a spatial light modulator (SLM) configured as an SLM-encoder that uses the at least one spreading-sequence for-yielding a frequency-domain-encoded-optical-signal;
   transforming the frequency-domain-encoded-optical-signal to a time-domain-encoded-optical-signal; and
   converting the time-domain-encoded-optical-signal to the optical SS2-signal.

3. The method of claim 2, wherein said converting the time-domain-encoded-optical-signal comprises preserving a phase of the time-domain-encoded-optical-signal.

4. The method of claim 2, wherein said encoding the frequency-domain-optical-signal comprises optically traversing a plurality of spectral components through the spreading-sequence of the SLM-encoder.

5. The method of claim 4, wherein said traversing of the plurality of spectral components comprises passing the plurality of spectral components through at least one row of pixels of the SLM-encoder, wherein the spreading-sequence is associated with one or more rows of pixels of the at least one row of pixels.

6. A method for de-spreading received signals, the method comprising:
   receiving a radio frequency (RF) doubly-spread-spectrum-signal (RSS2-signal) via a wireless communication link;
   de-spreading the RSS2-signal by using an optical second de-spreader, which is configured for converting the RSS2-signal into an optical RSS2-signal and producing an extracted-first-spread-spectrum-signal (ESS1-signal) wherein the frequency bandwidth (BW) of the RSS2-signal is greater than the frequency BW of the ESS1-signal; and
   producing a data signal from the ESS1-signal, wherein the frequency BW of the ESS1-signal is greater than the frequency BW of the data signal,
wherein the ESS1-signal is generated by having the optical RSS2-signal manipulated by the optical second de-spreader, using a de-spreading sequence out of at least one de-spreading sequence; and
wherein the data signal is within the RF spectral range.

7. The method of claim 6, wherein said producing of the ESS1-signal comprises:
   correlating the optical RSS2-signal with the de-spreading-sequence out of the at least one de-spreading-sequence, thereby forming a correlated-signal;
   sampling the correlated-signal within a width of a correlation pulse; and
   assembling the ESS1-signal based on said correlating of the optical RSS2-signal and said sampling the correlated-signal.

8. The method of claim 7, wherein said assembling the ESS1-signal comprises:
   probing the optical RSS2-signal at a rate defined by a time-shift between consecutive probings, wherein said probing occurs at least once per chip;
   generating the correlation pulse by calculating a sum of multiplications of the de-spreading-sequence by an outcome of said probing in each time-shift;
   performing an integration of the outcome of the probing in each time-shift, resulting in a plurality of integrations;
   searching for a highest value outcome of the integration out of the plurality of integrations; and
   determining a synchronization area within boundaries of the correlation pulse.

9. The method of claim 6, wherein said generating of the ESS1-signal is done by:
   converting the RSS2-signal to an optical-signal by an optical-modulator using an optical-generator and an optical modulator for converting the RSS2-signal to the optical RSS2-signal;
   transforming the optical RSS2-signal to a frequency-domain-optical-signal characterized by a plurality of spectral components;
   decoding the frequency-domain-optical-signal by an SLM configured as an SLM-decoder comprising the de-spreading-sequence, thereby yielding a frequency-domain-decoded-optical-signal;
   transforming the frequency-domain-decoded-optical-signal to a time-domain-decoded-optical-signal;
   optically-sampling the time-domain-decoded-optical-signal within an optical correlation pulse width for yielding an optically sampled time-domain-correlated-optical-signal; and converting the optically sampled time-domain-correlated-optical-signal to the ESS1-signal.

10. The method of claim 9, wherein said optically-sampling the time-domain-decoded-optical-signal comprises:
   optically-probing the time-domain-decoded-optical-signal at a plurality of time-shifts;
   performing an integration for each outcome of said optically-probing in each time-shift, resulting in a plurality of integrations;
   searching for a highest value outcome of the integration out of the plurality of integrations; and
   determining a synchronization area within boundaries of the optical correlation pulse width.

11. The method of claim 9, wherein said optically-sampling the time-domain-decoded-optical-signal utilizes a serial search technique for determining an optimal optical sampling timing of the optical correlation pulse.

12. The method of claim 9, wherein said decoding the frequency-domain-optical-signal comprises optically traversing a plurality of spectral components through the de-spreading-sequence of the SLM-decoder.

13. The method of claim 12, wherein said traversing comprises passing of the plurality of spectral components through at least one row of pixels of the SLM-decoder, wherein the de-spreading-sequence is associated with one or more rows of pixels of the at least one row of pixels.

14. The method of claim 6, wherein the RSS2-signal is within the radio frequency (RF) spectral range, and wherein the converting of the RSS2-signal into the optical RSS2-signal comprises a frequency-converter.

15. The method of claim 6 further comprising extracting a plurality of information replicas encapsulated in the RSS2-signal, wherein the replicas are used for improving a signal to noise ratio of the RSS2-signal.

16. A transmitter's cascaded spread-spectrum system, the system comprising:
   a first-spreader configured to spread a data-signal for generating a corresponding first-spread-spectrum-signal (SS1-signal), wherein the frequency bandwidth of the SS1-signal is greater than the frequency bandwidth of the data-signal; and
   an optical second-spreader that is configured for converting the SS1-signal into an optical SS1-signal and further spread the optical SS1-signal to an optical doubly spread spectrum signal (optical SS2-signal), wherein the frequency bandwidth of the optical SS2-signal is greater than the frequency bandwidth of the SS1-signal; and
   a frequency converter, configured to convert the optical SS2-signal into a radio frequency (RF) SS2 signal (RSS2-signal), wherein the frequency BW of the RSS2-signal is greater than the frequency BW of the SS1-signal, for transmitting of the RSS2-signal via a wireless communication network,
   wherein the optical SS2-signal is generated by having the optical SS1-signal manipulated by the optical second spreader using a spreading-sequence out of at least one spreading-sequence, and
   wherein the RSS2-signal is generated for transmitting of the RSS2-signal via a wireless communication network.

17. The system of claim 16, wherein said optical second-spreader is an optical spreader comprising:
   an optical-generator;
   an optical-modulator adapted to utilize said optical-generator to convert the SS1-signal to a time-domain-optical-signal;
   Fourier-transform-optics utilized to transform the time-domain-optical-signal to frequency-domain-optical-signal;
   an SLM configured as an SLM-encoder comprising the spreading-sequence or the another spreading-sequence configured to encode the frequency-domain-optical-signal to a frequency-domain-encoded-optical-signal;
   an inverse-Fourier-transform-optics adapted to transform the frequency-domain-encoded-optical-signal to a time-domain-encoded-optical-signal; and
   an optical to electrical converter adapted to convert the time-domain-encoded-optical-signal to an SS2-signal.

18. A receiver's cascaded spread-spectrum system, the system comprising:
   an optical second de-spreader configured to receive a radio frequency (RF) doubly spread spectrum signal (RSS2-signal), via a wireless communication link, and convert the received RSS2-Signal into an optical RSS2-signal and generate an extracted-spread-spectrum-signal (ESS1-signal), wherein the frequency bandwidth of the RSS2-signal is greater than the frequency bandwidth of the ESS1-signal; and
   a first de-spreader configured to further de-spread the ESS1-signal to a data-signal that is within the RF frequency range, wherein the frequency bandwidth of the ESS1-signal is greater than the frequency bandwidth of the data-signal
wherein the ESS1-signal is generated by having the optical RSS2-signal manipulated by the optical second de-spreader, using a de-spreading sequence out of at least one de-spreading sequence.

19. The system of claim 18, wherein said optical second de-spreader is an optical correlator comprising:
   an optical-generator used to emit light;
   an optical-modulator adapted to utilize said optical-generator to convert the RSS2-signal to a time-domain-optical-signal;
   Fourier-transform-optics utilized to transform the time-domain-optical-signal to a frequency-domain-optical-signal;
   SLM configured as an SLM-decoder comprising the de-spreading-sequence or another de-spreading-sequence configured to decode the frequency-domain-optical-signal to a frequency-domain-decoded-optical-signal;
   an inverse-Fourier-transform-optics adapted to transform the frequency-domain-decoded-optical-signal to a time-domain-decoded-optical-signal;
   a pulse detector and an integrator mutually utilized to determine a synchronization area within an optical correlation pulse width, wherein the time-domain-decoded-optical-signal is extracted from the synchronization area; and
   an optical to electrical converter adapted to convert the time-domain-decoded-optical-signal to an ESS1-signal.

* * * * *